United States Patent
Hastings

(10) Patent No.: US 11,669,763 B2
(45) Date of Patent: Jun. 6, 2023

(54) QUANTUM PROCEDURES FOR APPROXIMATE OPTIMIZATION BY QUENCHING

(71) Applicant: Microsoft Technology Licensing, LLC, Redmond, WA (US)

(72) Inventor: Matthew Hastings, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1079 days.

(21) Appl. No.: 16/392,397

(22) Filed: Apr. 23, 2019

(65) Prior Publication Data

US 2020/0202249 A1 Jun. 25, 2020

Related U.S. Application Data

(60) Provisional application No. 62/782,254, filed on Dec. 19, 2018.

(51) Int. Cl.
*G06N 10/00* (2022.01)
*G06F 15/16* (2006.01)
*G06F 30/20* (2020.01)

(52) U.S. Cl.
CPC ............ *G06N 10/00* (2019.01); *G06F 15/16* (2013.01); *G06F 30/20* (2020.01)

(58) Field of Classification Search
CPC ........ G06N 10/00; G06N 5/003; G06F 15/16; G06F 30/20
See application file for complete search history.

(56) References Cited

U.S. PATENT DOCUMENTS

| | | | | |
|---|---|---|---|---|
| 9,152,746 | B2* | 10/2015 | Troyer | G06F 30/20 |
| 10,152,454 | B2* | 12/2018 | Karimi | G06N 5/025 |
| 10,176,433 | B2* | 1/2019 | Hastings | G06N 99/00 |
| 10,275,422 | B2* | 4/2019 | Israel | G06N 10/00 |
| 2017/0330101 | A1* | 11/2017 | Hastings | G06N 99/007 |
| 2020/0134502 | A1* | 4/2020 | Anschuetz | G06N 10/00 |

OTHER PUBLICATIONS

Quantum computing. Andrew Steane (Year: 1998).*
Quantum quench dynamics. Aditi Mitra (Year: 2017).*
Quantum computing for beginners. Ajit Narayanan (Year: 1999).*
Callison et al., "Finding spin glass ground states using quantum walks," arXiv:1903.05003v3, 34 pp. (Dec. 2019).
Hastings et al., "A Short Path Quantum Algorithm for Exact Optimization," arXiv:1802.10124v3, 22 pp. (Jul. 2018).

(Continued)

*Primary Examiner* — Vibol Tan
(74) *Attorney, Agent, or Firm* — Klarquist Sparkman, LLP

(57) ABSTRACT

In this disclosure, example quantum algorithms for approximate optimization based on a sudden quench of a Hamiltonian. While the algorithm is general, it is analyzed in this disclosure in the specific context of MAX-EK-LIN2, for both even and odd K. It is to be understood, however, that the algorithm can be generalized to other contexts. A duality can be found: roughly, either the algorithm provides some nontrivial improvement over random or there exist many solutions which are significantly worse than random. A classical approximation algorithm is then analyzed and a similar duality is found, though the quantum algorithm provides additional guarantees in certain cases.

19 Claims, 6 Drawing Sheets

(56) References Cited

OTHER PUBLICATIONS

Hastings, "Duality in Quantum Quenches and Classical Approximation Algorithms: Pretty Good or Very Bad," arXiv:1904.13339v2, 21 pp. (Apr. 2019).

International Search Report and Written Opinion dated Apr. 15, 2020, from International Patent Application No. PCT/US2019/066957, 15 pp.

Morley et al., "Quantum search with hybrid adiabatic-quantum walk algorithms and realistic noise," *Physical Review A*, vol. 99, No. 2, 23 pp. (Jan. 2018).

Yang et al., "Optimizing Variational Quantum Algorithms using Pontryagin's Minimum Principle," arXiv:1607.06473v1, 7 pp. (Jul. 2016).

Altshuler et al., "Anderson localization casts clouds over adiabatic quantum optimization," *Proc. of National Academy of Sciences*, vol. 107, No. 28, pp. 12446-12450 (2010).

Barak et al., "Beating the random assignment on constraint satisfaction problems of bounded degree," *Electronic Colloquium on Computational Complexity*, vol. 22, pp. 1-15 (May 2015).

Berry et al., "Hamiltonian simulation with nearly optimal dependence on all parameters," *IEEE Symp. on Foundations of Computer Science*, pp. 792-809 (2015).

Farhi et al., "A Quantum Adiabatic Evolution Algorithm Applied to Random Instances of an NP-Complete Problem," *Science*, vol. 292, Issue 5516, pp. 472-475 (Apr. 2001).

Farhi et al., "A Quantum Approximate Optimization Algorithm," arXiv:1411.4028v1, MIT-CTP/4610, pp. 1-16 (Nov. 2014).

Farhi et al., "A Quantum Approximate Optimization Algorithm Applied to a Bounded Occurrence Constraint Problem," arXiv:14126062v2, MIT-CTP/4628, pp. 1-13 (Jun. 2015).

Hastad, "On bounded occurrence constraint satisfaction," *Information Processing Letters*, vol. 74, pp. 1-9 (Feb. 2000).

O'Donnell, *Analysis of Boolean Functions*, Cambridge University Press, pp. 1-419 (2014).

\* cited by examiner

600 perform, on a classical computing device, a quantum quench algorithm using simulation of a quantum Hamiltonian to perform approximate optimization - 610

Fig. 6

QUANTUM PROCEDURES FOR APPROXIMATE OPTIMIZATION BY QUENCHING

CROSS-REFERENCE TO RELATED APPLICATIONS

This application claims the benefit of U.S. Provisional Application No. 62/782,254 entitled "QUANTUM PROCEDURES FOR APPROXIMATE OPTIMIZATION BY QUENCHING" filed on Dec. 19, 2018, which is hereby incorporated herein by reference in its entirety.

SUMMARY

In this disclosure, example quantum algorithms for approximate optimization based on a sudden quench of a Hamiltonian. While the algorithm is general, it is analyzed in this disclosure in the specific context of MAX-EK-LIN2, for both even and odd K. It is to be understood, however, that the algorithm can be generalized to other contexts. A duality can be found: roughly, either the algorithm provides some nontrivial improvement over random or there exist many solutions which are significantly worse than random. A classical approximation algorithm is then analyzed and a similar duality is found, though the quantum algorithm provides additional guarantees in certain cases.

The embodiments disclosed herein include example methods for performing an approximate optimization technique using a quantum quench algorithm. In one embodiment, for instance, a quantum computing device is configured to perform an approximate optimization technique to approximate a solution to a combinatorial optimization problem. The approximate optimization technique is then performed on the quantum computing device. In this embodiment, the approximate optimization technique includes using a quantum quench algorithm. In certain implementations, the quench algorithm includes averaging state values over a plurality of times. In particular implementations, the controlling comprises changing coupling constants without using a jump or slow change in the coupling constants. In some examples, the changing of the coupling constants is performed non-adiabatically. In certain examples, the changing of the coupling constants is followed by an equilibration time. In some implementations, the method further comprises reading out results of the approximate optimization technique from the quantum computing device; and storing the results in a classical computing device.

Also disclosed are example embodiments for performing a quantum quench algorithm on a classical computing device using simulation of a quantum Hamiltonian to perform approximate optimization.

The foregoing and other objects, features, and advantages of the disclosed technology will become more apparent from the following detailed description, which proceeds with reference to the accompanying figures.

BRIEF DESCRIPTION OF THE DRAWINGS

FIG. 6 is another example method for performing an approximate optimization technique using a quantum quench algorithm as disclosed herein.

DETAILED DESCRIPTION

I. General Considerations

Figure 1:
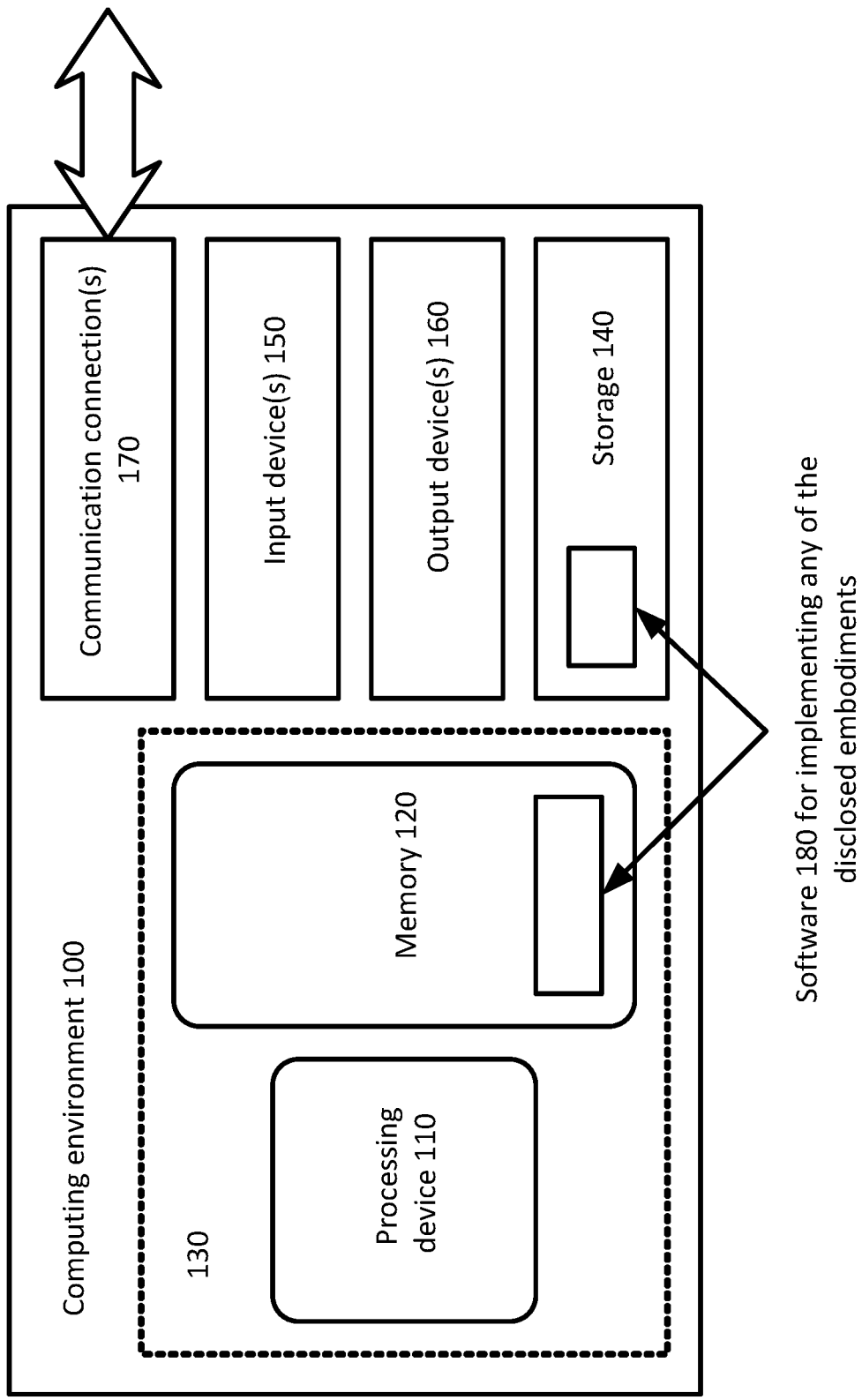
FIG. 1 illustrates a generalized example of a suitable classical computing environment in which several of the described embodiments can be implemented.

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

II. Introduction

For many combinatorial optimization problems, one expects that it is not possible to obtain an exact solution in polynomial time. Instead, the best that one can hope for is to obtain an approximate solution. In this disclosure, a general approach is presented to constructing quantum approximation algorithms based on the idea of a quench: a sudden change in the Hamiltonian. Further, a duality is analyzed that one can call "pretty good or very bad", in which the algorithm either finds a nontrivial improvement over random (termed "pretty good") or there exist many solutions which are significantly worse (termed "very bad"). A similar duality in the context of a classical approximation algorithm is also analyzed.

In this disclosure, the optimization problem MAX-EK-LIN-2 is considered, with the assumption of a degree bound explained below. Roughly speaking, this problem MAX-≤K-LIN-2 considers an objective function which is a sum of terms of degree K; a more precise definition is given later. An instance is considered with degree D, so that each degree of freedom participates in D terms in the problem. Previous work has shown that for odd K it is possible to obtain a nontrivial approximation of order $1/\sqrt{D}$ for MAX-EK-LIN-2 using a classical algorithm (see. e.g., B. Barak, A. Moitra, R. O'Donnell, P. Raghavendra, O. Regev, D. Sterner, L. Trevisan, A. Vijayaraghavan, D. Witmer, and J. Wright, arXiv preprint arXiv:1505.03424 (2015)) (initially a quantum algorithm was found providing weaker approximation guarantees but later the classical algorithm was discovered (see, e.g., E. Farhi, J. Goldstone, and S. Gutmann, arXiv preprint arXiv:1412.6062 2, 13)). but later a classical algorithm was discovered with better approximation guarantees). Further, for arbitrary K, the classical algorithm finds a solution which is either better than random by an amount $1/\sqrt{D}$ or worse by an amount of order $1/\sqrt{D}$. (This result for K odd implies the order $1/\sqrt{D}$ improvement since if the algorithm find a result result than random by order $1/\sqrt{D}$, one can change the sign of all variables an obtain an improvement by order $1/\sqrt{D}$.

Also considered is a slightly different but related classical approximation algorithm where it was found (for arbitrary K, though the result is most interesting for even K) that the duality above generalizes to this: rather than being better or worse by $1/\sqrt{D}$, one can instead choose it to be slightly better or much worse. In this case, if the instance does not have a solution which is much worse, then the algorithm is guaranteed to find a slight improvement.

Embodiments of the disclosed technology also a quantum algorithm based on quenches. Rather than slowly changing a Hamiltonian as in the adiabatic algorithm (see, e.g., E. Farhi, J. Goldstone, S. Gutmann, J. Lapan, A. Lundgren, and D. Preda, Science 292, 472 (2001) which in general is expected to have trouble with small energy gaps (see. e.g., B. Altshuler, H. Krovi, and J. Roland, Proceedings of the National Academy of Sciences 107, 12446 (2010))), one can suddenly change the Hamiltonian, but then spend some time evolving under the new Hamiltonian. In accordance with certain embodiments, a general method for approximate optimization is disclosed. In particular examples, the general method is analyzed in the context of MX-EK-LIN-2. Here, a similar duality is found but with slightly different requirements: in some ways, the quantum algorithm requires only weaker assumptions in order to find a nontrivial improvement.

A. Problem Definition and Examples

Consider the problem MAX-EK-LIN-2. There are N degrees of freedom, each of may take values in $\{-1, +1\}$. The objective function, which one can denote as $H_Z$, is taken to be a weighted sum of monomials of degree at least 1 and at most K in these variables, e.g., each monomial is a product of at least 1 and at most K distinct variables. One can require that the weight of each monomial be chosen from $\{-1, +1\}$, and that all monomials be distinct from each other.

Consider an optimization problem where the goal is to maximize this objective function. One can emphasize this since a Hamiltonian which includes a term proportional to $H_Z$, will be later considered and states near the highest energy state of that Hamiltonian, rather than the lowest energy state as more commonly done in physics, will also be considered.

One can write the variables as $Z_i$ when $i \in \{1 \ldots N\}$ so that there are N variables, so for MAX-E2-LIN-2 one has $$H_Z = \sum_{i<j} J_{ij} Z_i Z_j, \quad (1)$$

where $J_{ij}$ is a matrix with entries chosen from $\{-1, 0, +1\}$.

A degree bound D will be assumed, so that each variable $Z_i$ appears in at most D distinct monomials in $H_Z$. Indeed, for simplicity only the case where each $Z_i$ appears in exactly D monomials in $H_Z$ will be considered. One can define $N_T$ to equal the number of terms in $H_Z$ so that if every term has degree exactly D (e.g., for MAX-EK-LIN-2) one has $$N_T = \frac{DN}{K},$$

and for MAX-K-LIN-2 one has $$DN \geq N_T \geq \frac{DN}{K}. \quad (2)$$

A random assignment has expectation value of $H_Z$ equal to 0. Typically in computer science, one regards each of these monomials as a constraint: the constraint is satisfied if the monomial is equal to +1 and it is violated otherwise, so that the number of satisfied constraints is equal to the value of $H_Z$ plus $N_T/2$. Hence, random assignment satisfies half the constraints on average. Then, the approximation ratio achieved by some assignment to the variables is defined to be the fraction of constraints satisfied by that assignment divided by the fraction of constraints satisfied by the optimal assignment.

One can define the approximation ratio differently: define it to be the value of $H_Z$ for a given assignment divided by the value of $H_Z$ in the optimal assignment. That is, this term $N_T/2$ will not be added.

In certain examples, it is said that an assignment improves by a factor $f$ over random if it has $H_Z \geq fN_T$. Further, in certain examples, it is said that an algorithm is worse than random by a factor $f$ if it has $H_Z \leq -fN_T$.

It is known that it is always possible to obtain an $\Omega(1/D)$ approximation ratio with a polynomial time algorithm for MAX-K-LIN-2. (see. e.g., J. Hastad, Information Processing Letters 74, 1 (2000)). More strongly, for any instance it is always possible to find an assignment which improves by a factor $1/D$ over random in polynomial expected time. For odd K, however, it is possible to improve over a random assignment by $\exp(-O(K))/\sqrt{D}$ in polynomial time. (See, e.g., B. Barak, A. Moitra, R. O'Donnell, P. Raghavendra, O. Regev, D. Sleurer, L. Trevisan, A. Vijayaraghavan, D. Witmer, and J. Wright, arXiv preprint arXiv:1505.03424 (2015).)

One cannot expect to have such an improvement for even K simply because there exist families of instances in which no assignment has $H_Z$ larger than $N_T \cdot \mathcal{O}(1/D)$. For K=2, a simple such example is to choose $$H_Z = -\sum_{i<j} Z_i Z_j. \quad (3)$$

Here one has taken D=N−1 so that every variable is in some monomial with another variable. It is possible to obtain a very large negative expectation value of $H_Z$ (e.g., $-N(N-1)/2$) by choosing all $Z_i$ to have the same sign, but for even N, the maximum positive expectation value of $H_Z$ is to choose N/2 tat the $Z_i$ to equal +1 and the remainder to equal −1, giving expectation value N/2, which is proportional to $N_T/N$. This example provides an early example of the duality: the maximum improvement over random is quite small (O(1/D)) but one can find an assignment is a factor $\Omega(1)$ worse than random.

For K=2m, one can generalize example (3) to give an instance for MAX-EK-LIN-2 as follows: let N=mD. Divide the set of mD variables into D disjoint sets, each containing m variables. Label the sets by integers in 1, ..., D. Let $\tilde{Z}_i$ be the product of the variables in the i-th set. Let $H_Z = -\Sigma_{i<j} \tilde{Z}_i \tilde{Z}_j$.

B. Outline, Notation, and Results

In section III, an example embodiment of the quench algorithm is defined, both in the specific form that is analyzed later as well as some variants that may be useful. In section IV, some results are collected that will be useful in analyzing the classical algorithm that are given later as well as in analyzing the quantum algorithm. In section V, the classical algorithm is defined and analyzed; this section will give some notation and probabilistic results that will be used in the quantum algorithm. In section VI, the example embodiment of the quantum algorithm is analyzed.

III. Quench Algorithm

To define the algorithm, one can promote the variables to qubits, and let $Z_i$ be the Pauli Z operator on the i-th qubit. Let $X_i$ be the Pauli N operator on the i-th qubit and let $$X = \sum_i X_i. \tag{4}$$

The following algorithm can then be used. Let $$H = X + \frac{\alpha}{D} H_Z, \tag{5}$$

where $\alpha$ is a scalar chosen later. The system can be prepared in the state $\psi_+$ maximally polarized in the + direction so that $X_i = +1$ for all i. One can then evolve the system under Hamiltonian H for a time T that will be explained later. This time will in all cases be at most poly(N); indeed, the analysis will be for T=O(1). Hence, this evolution can be performed in polynomial time on a quantum computer in time polynomial in $t_{max}$ and polynomial in the inverse error (see, e.g., D. W. Berry, A. M. Childs, and R. Kothari, 2015 IEEE Symposium on Foundations of Computer Science, 792 (2015)); indeed, the simulation can be performed in time polylogarithmic in the inverse error but this will not be needed. In any simulation algorithm on a quantum computer, one can discretize the variable t; for example, one may choose it to equal an integer multiple of some time $t_{min}$ for some $t_{min}$ which is polynomially small; this causes only a polynomially small error. Finally, one can measure the state of the system in the computational basis, giving an assignment of variables $Z_i$.

In the analysis of the algorithm, one can ignore all the errors associated with the time evolution and the discretization of time, since a polynomially small error is negligible as may be verified.

When one applies this algorithm, one can often repeat the algorithm several times with T chosen from an appropriate distribution as described in section VI, repeating the $H_Z$ measurement each time. In this regard, it is interesting to think about the state arising from averaging T over an interval of times; by choosing the time from a random distribution (or more generally, by performing phase estimation of the Hamiltonian H) one can decohere the system in an eigenbasis. The fixed evolution has a similar effect but is easier to analyze using the techniques here. Also, it may be useful to consider a generalization of the algorithm in which one does some slow (but not necessarily adiabatic) evolution of the Hamiltonian from an initial Hamiltonian X to $H=X+(\alpha/D)H_Z$, followed by an additional time evolving under $H=X+(\alpha/D)H_Z$.

A. Motivation

In this section, the algorithm is heuristically explained. The time evolution has two purposes. The first is to decohere different eigenstates of the Hamiltonian as mentioned; for a fixed time, the evolution still for time t still produces a pure state, but still produces some change in phase for different energies which has a similar effect to a random evolution. The second purpose is to do it in a way that conserves energy. One hopes that the decoherence between different eigenstates will lead to a reduction in the expectation value of X, since one hopes that individual eigenstates will not have large X. This reduction will lead to a positive expectation value of $H_Z$ due to the energy conservation as will now be explained: this energy conservation is the second reason for the time evolution.

For arbitrary operators O, H and scalar t, define $\tau_t^H(O) = \exp(itH) O \exp(-itH)$. Define $$\langle O \rangle_+ = \langle \psi_+ | O | \psi_+ \rangle. \tag{6}$$

One has $$\langle \tau_T^H(H) \rangle_+ = N, \tag{7}$$

Independent of T by energy conservation. Hence, one has $$\langle \tau_T^H(H_Z) \rangle = D \frac{N - \langle \tau_T^H(X) \rangle_+}{\alpha}. \tag{8}$$

That is, if the state at time T has an expectation value of X that is smaller than the maximal (e.g. smaller than N), it necessarily has an expectation value of $H_Z$ that is positive. In other words, it has obtained some solution that is better than random. This is one of the notable aspects behind the quench algorithm.

B. Heuristic Choices of $\alpha$

This section discusses now to choose $\alpha$. A calculation is given that introduces some of the notation used later. Perturbation theory to only a second order is considered, and a purely heuristic treatment of higher orders to motivate the choice of $\alpha$ is given. Later, a different treatment is given.

Consider the series for $\tau_T^H(X_i)$ for some given i: for any operator O, one has the series $$\tau_T^H(O) = O - iT[O, H] - \frac{T^2}{2}[[O, H], H] + \tag{9}$$

$$i\frac{T^3}{3!}[[[O, H], H], H] + \frac{T^4}{4!}[[[[O, H], H], H], H] + \ldots$$

So, one has $$\tau_T^H(X) = X - i\frac{\alpha T}{D}[X, H_Z] - \frac{\alpha^2}{D^2}\frac{T^2}{2}[[X, H_Z], H] + \ldots, \quad (10)$$

where the dots denote terms of order $T^3$ or higher. Hence, $$\langle X \rangle = \left\langle X - \frac{\alpha^2}{D^2}\frac{T^2}{2}[[X, H_Z], H]\right\rangle_+ + \ldots \quad (11)$$

$$= N - \frac{\alpha^2}{D^2}\frac{T^2}{2}N + \ldots,$$

where the following is use $\langle[[X, H_Z], H]\rangle_+ = \Sigma_i \langle[[X_i, H_Z], H_Z]\rangle_+ = ND$. and so $$\langle H_Z \rangle = \frac{\alpha T^2}{2}N + \ldots \quad (12)$$

Of course, the higher order corrections to this perturbation theory must become important for large enough T, $\alpha$. For one thing, once T≲1, the effects of higher order terms in TX in the exponential become important, e.g., one must consider higher order commutators such as $[[[H_Z], X], X], H_Z]$. However, one might hope that for some T of order unity (for example T=½) the ignore higher orders in TX will not be too important; maybe they will not be negligible but one can hope that they will only slightly reduce the result.

However, even for such a fixed T=½, one cannot ignore higher order terms in $(\alpha/D)H_Z$ for large enough $\alpha$. For example, if $\alpha$ is sufficiently larger than $\sqrt{D}$, one would find that Eq. (11) gives a result for X which is smaller than −N, which is impossible.

So, the most optimistic outcome that one can hope for is that second order perturbation theory is roughly accurate up to some T of order unity such as T=½ and up to $\alpha$ proportional to $\sqrt{D}$. If so, one would find that the best choice of $\alpha$ would be to take $\alpha$ proportional to $\sqrt{D}$, in which case one would have $\langle H_Z\rangle$ proportional to $N\sqrt{D}$, which is proportional to $N_T \cdot \Omega(1/\sqrt{D})$.

However, this heuristic analysis is likely too optimistic. Such solutions do exist for MAX-EK-LIN-2 for odd K (though it has not been shown that the algorithm finds them), but they do not exist in general, such as the example of (3).

IV. Rounding

In this section, some general results are given on how, given a solution to an optimization problem for a polynomial in several vectorial variables, one can construct a solution to the same problem where all variables are chosen to be the same. Theorem 1 is the main result. This result will be used in both the classical and quantum algorithms; the vectors $\vec{w}_a$ are the solution to the problem using several vectorial variables. while the $\vec{u}$ is the solution with all variables the same.

The way one can use these theorems is as follows. $H_Z$ as a degree-K polynomial in variables $Z_i$ is given. Each $Z_i$ is chosen from $\{-1, +1\}$. Let $\vec{Z}$ be a vector of choices of variables Z. One can write $H_Z(\vec{Z})$ to denote the value of $H_Z$ for that given set of choices.

One can randomly round choices of $Z_i$ from the interval [−1, +1] to choices of $Z_i$ from the discrete set $Z_i=\{-1, +1\}$ while preserving expectation value. Formally, consider a vectorial variable $\vec{v}$ with each entry is chosen from the interval [−1, −1]. Then, independently choosing each $Z_i$ at random from $\{-1, +1\}$, picking the probability for each $Z_i$ so that $\mathbb{E}[Z_i]=v_i$, one has $\mathbb{E}[H_Z(\vec{Z})]=H_Z(\vec{v})$.

Now, let one define a polynomial $H_Z(\vec{v}_1, \vec{v}_2, \ldots, \vec{v}_K)$ which depends upon K different vectorial variables as follows. This polynomial will be homogeneous of degree 1 in each variable. For each term in $H_Z$ of the form $cZ_{i_1}, Z_{i_2}, \ldots Z_{i_K}$, where c is a scalar and $i_1, i_2, \ldots, i_K$ are a sequence of distinct choices of i, one has a corresponding term in $H_Z(\vec{v}_1, \ldots, \vec{v}_K)$ equal to $$c\frac{1}{K!}\sum_\pi (\vec{v}_1)_{i_{\pi(1)}}(\vec{v}_2)_{i_{\pi(1)}}\ldots(\vec{v}_K)_{i_{\pi(1)}},$$

where the sum is over permutations $\pi$ on K elements and $(\vec{v}_a)_b$ denotes the b-th entry of vector $\vec{v}_a$. For example, for K=2, given a term $-Z_2Z_3$ one has the corresponding term $-(\frac{1}{2})(\vec{v}_1)_2(\vec{v}_2)_3 - (\frac{1}{2})(\vec{v}_2)_3(\vec{v}_1)_2$. Here in an abuse of notation, the same symbol $H_Z(\cdot)$ is used for two different functions, one depending on K vectorial arguments and one depending on a single vectorial argument.

Note that $$H_Z(\vec{v}, \vec{v}, \ldots, \vec{v})=H_Z(\vec{v}). \quad (13)$$

The purpose of the rounding results will be, given some choice of $\vec{v}_1, \ldots, \vec{v}_K$ such that $H_Z(\vec{v}_1, \ldots, \vec{v}_K)$ has a certain magnitude, one can find a choice of $\vec{v}$ such that $H_Z(\vec{v})$ obeys certain conditions on its magnitude.

This will then be used in the classical setting in the following simple way: one can pick some vector $\vec{w}_2$ at random and then choose $\vec{w}_1$ greedily to optimize $H_Z(\vec{w}_1, \vec{w}_2, \vec{w}_2, \vec{w}_2, \ldots, \vec{w}_2)$. Here the variable $\vec{w}_1$ appears 1 time while the variable $\vec{w}_2$ appears K−1. This will give one the choice of K different vectorial variables (though one variable is repeated K−1 times) from which one will construct a solution with a single variable.

Case 3 of the following theorem will be useful for the classical algorithm. Case 2 follows from case 3 with $\epsilon=1$ but has slightly tighter bounds. Case 1 is given for completeness. Thus, the reader may consider only case 3.

Theorem 1. Let $P(\vec{v}_1, \vec{v}_2, \ldots, \vec{v}_K)$ be a polynomial in vectorial variables $\vec{v}_1, \ldots, \vec{v}_K$ which is homogeneous of degree 1 in each argument so that $$P(\vec{v}_1, \ldots, \vec{v}_K) = \sum_{i_1, \ldots, i_K} a_{i_1, \ldots, i_K} \prod_a (\vec{v}_a)_{i_a}, \quad (14)$$

where $(\vec{v}_a)_i$ denotes the i-th entry of vector $\vec{v}_a$.

Assume that all vectors $\vec{v}_a$ have the same number of entries, and assume that P is symmetric under permuting its arguments, e.g., that $a_{i_1, \ldots, i_K}$ is symmetric under permuting its arguments.

Then the following holds:

1. Suppose that there exist some vectors $\vec{w}_1, \ldots, \vec{w}_K$ such that $P(\vec{w}_1, \ldots, \vec{w}_K) = C$ and such that $|(\vec{w}_a)_i| \leq 1$ for all $a, i$. Then, there exits some vector $\vec{u}$ with $$|(\vec{u}_i)| \leq 1$$

for all i such that $$|P(\vec{u}, \vec{u}, \ldots, \vec{u})| \geq \frac{K!}{K^K} C. \qquad (15)$$

2. Suppose that there exist vectors $\vec{w}_1, \vec{w}_2$ such that $P(\vec{w}_1, \vec{w}_2, \vec{w}_2, \vec{w}_2, \ldots, \vec{w}_2) = C$ and such that $|(\vec{w}_a)_i| \leq 1$ for all $a, i$. (That is, the variable $\vec{w}_1$ appears 1 time while the variable $\vec{w}_2$ appears K−1 times. Then, there exists some vector $\vec{u}$ with $$|(\vec{u}_i)| \leq |(\vec{w}_1)_i| + |(\vec{w}_2)_i|$$

for all i such that $$|P(\vec{u}, \vec{u}, \ldots, \vec{u})| \geq P(\vec{w}_2, \vec{w}_2, \ldots, \vec{w}_2) + C \cdot \Omega(1/K). \qquad (16)$$

3. Suppose that there exist vectors $\vec{w}_1, \vec{w}_2$ such that $P(\vec{w}_1, \vec{w}_2, \vec{w}_2, \vec{w}_2, \ldots, \vec{w}_2) = C$. Then for any $\epsilon > 0$, at least one of the following two possibilities holds:

A there exists some vector $\vec{u}$ with $|(\vec{u}_i)| \leq |(\vec{w}_1)_i| + |(\vec{w}_2)_i|$ for all i such that $$|P(\vec{u}, \vec{u}, \ldots, \vec{u})| \geq P(\vec{w}_2, \vec{w}_2, \ldots, \vec{w}_2) + \epsilon C \cdot \Omega(1) \qquad (17)$$

or

B then exists some vector $\vec{u}$ with $|(\vec{u}_i)| \leq |(\vec{w}_1)_i| + |(\vec{w}_2)_i|$ for all i such that $$|P(\vec{u}, \vec{u}, \ldots, \vec{u})| \leq P(\vec{w}_2, \vec{w}_2, \ldots, \vec{w}_2) - C \cdot \exp(-O(K)/\epsilon). \qquad (18)$$

Further, in all cases, one can find $\vec{u}$ up to any desired nonzero error in a time linear in N, exponential in K, and at most polynomial in inverse error compared to magnitude of the terms in the polynomial.

Note that item 1 above allows all of the $\vec{w}_a$ to be distinct. Items 2,3 consider the case of just two different $\vec{w}_a$, with $\vec{w}_2$ repeated K−1 times in the argument of $P(\cdot)$. One can summarize item 2 as saying that one can obtain a solution whose absolute value is close to C, while item 3 can be summarized for small $\epsilon$ as saying that, compared to $P(\vec{w}_2, \vec{w}_2, \ldots, \vec{w}_2)$, either one can improve by a small amount (this is the "pretty good") or there is a solution which is much worse (this is the "very bad"). Note also that the bound on $|(\vec{u})_i|$ is different in item 2 compared to items 1,3.

One can now prove the theorem. Define a function $\vec{u}(\cdot)$, from $\mathbb{R}^K$ to vectors, by $$\vec{u}(x_1, \ldots, x_K) = \sum_a u_a \vec{v}_a, \qquad (19)$$

where $x_a \vec{v}_a$ denotes the vector with i-th entry equal to $x_a (\vec{v}_a)_i$.

One can first prove item 1 of theorem 1. One needs:

Lemma 1. Let $p(x_1, \ldots, x_K)$ be a polynomial (not necessarily homogenous) of degree at most K in real variables $x_1 \ldots, x_K$. Suppose that the coefficient of the term $\Pi_i x_i$ in $p(\cdot)$ is equal to C. Then, for some choice of $x_1, \ldots, x_K \in \{-1, +1\}^K$ one has that $|p(x_1, \ldots, x_K)| \geq C$.

Proof. It is claimed that $$C = \frac{1}{2^K} \sum_{x_1, \ldots, x_K \in \{-1, +1\}^K} \left( \prod_i x_i \right) \cdot p(x_1, \ldots, x_K). \qquad (20)$$

This holds because any term in $p(\cdot)$ proportional to $\Pi_i x_i^{d_i}$ for some sequence of integers $d_i$ will vanish in the weighted sum above unless all $d_i$ are odd. However, since $p(\cdot)$ has degree d, the only such nonvanishing term is that with all $d_i = 1$.

Hence, $|C| \leq \max_{x_1, \ldots, x_K \in \{-1, +1\}^K} (|p(x_1, \ldots, x_K)|)$. □

To prove item 1, consider polynomial $Q(x_1, \ldots, q_K) \equiv P(\vec{u}(x_1, \ldots, x_K), \ldots, \vec{u}(x_1, \ldots, x_K))$. The polynominal $Q(\cdot)$ is of degree K and the coefficient of $\Pi_i x_i$ in $Q(\cdot)$ is equal to CK!. So, by lemma 1, there exists some choice of $x_1, \ldots, x_K \in \{-1, 1\}^K$ such that $|Q(x_1, \ldots, x_K)| \geq CK!$. Set $$\vec{u} = \frac{1}{K}(x_1, \ldots, x_K)$$

so that indeed $|(\vec{u})_i| \leq 1$ for all i.

Then, $|P(\vec{u}, \ldots, \vec{u})| \geq (1/K)^K CK!$. This prove item 1 and trivially one can find the choice of $\vec{u}$ by iterating over the $2^K$ possible choices of $x_1, \ldots, x_K \in \{-1, 1\}^K$.

Item 2 will next be proved. The following lemma applies:

Lemma 2. Let $p(x)$ be a polynomial of degree K with $p(x) = \sum_{0 \leq i \leq d} a_i x^i$. Then, for K odd $$\min_{x \in [-1, 1]} (|p(x)|) \geq |a_1|/K, \qquad (21)$$

and for K even $$\min_{x \in [-1, 1]} (|p(x)|) \geq |a_1|/(K-1), \qquad (22)$$

Proof. The proof is similar to the proof that that the Chebyshev polynomials have minimum absolute value on the interval [−1, 1] among all polynomials with given leading coefficients, e.g., with given value of $a_K$. In this case, one can instead fix the value of $a_1$, but the proof is almost the same.

First, without loss of generality, one can assume that $p(x) = -p(-x)$, as $(p(x) - p(-x))/2$ is also a polynomial of degree K with coefficient of the linear term also equal to $a_1$ and $|(p(x) - p(-x))/2| \leq \max(|p(x)|, |p(-x)|)$. So, one can assume that K is odd and the result for even K will follow immediately from the result for odd K.

Also, without loss of generality one may assume that $a_1 = 1$. Indeed, if $a_1 = 0$, then the result is trivial true, while for any nonzero $a_1$, one can instead consider $p(x)/a_1$.

Assume that the lemma is false, e.g., assume that $p(x)$ has maximum absolute value on the interval [−1, 1] which is strictly smaller than 1/K.

Let $T_n(x)$ be the Chebyshev polynomials of first kind. For odd K, $-(-1)^K \cdot T_K(x)/K$ is a polynomial of degree K which has coefficient of the linear term equal to 1. Further, $-(-1)^K \cdot T_K(x)/K$ has a maximum absolute value on the interval [−1, 1] equal to 1/K and it attains this maximum K+1 times on this interval at points $x=\cos(k\pi/K)$ for $0 \le k \le K$. Let $q(x)=p(x)+(-1)^K \cdot T_K(x)/K$. So, $q(x)$ has coefficient of the linear term equal to zero, e.g., since it is an odd function of x, one has $q(x)=\Sigma_{i=3,5,\ldots,K} b^i x^i$ for some coefficients $b_i$ and further by the assumption that $p(x)$ has absolute value strictly smaller than $1/K$ on the interval, one has that at points $x=\cos(k\pi/K)$ the sign of $q(x)$ is the same as the sign of $(-1)^K \cdot T_K(x)/K$. So, since the sign of $T_K(x)$ alternates at these points, e.g., the sign for even k is opposite to that for odd k, one has that $q(x)$ changes sign at least K times so $q(x)$ must have at least K−1 distinct zeros. However, $q(x)$ has degree K and the root at x=0 is triply degenerate so in fact $q(x)$ can only have at most K−2 distinct zeros, giving a contradiction. □

Define polynomial $Q(x) \equiv P(\vec{u}(x, 1, 1, \ldots, 1), \ldots, \vec{u}(x, 1, 1, \ldots, 1))$, e.g., in the argument of $\vec{u}$, 1 is repeated a total of K−1 times. Applying lemma 2 to $p(x)=Q(x)$, the result follows. One can find an x which maximizes $|Q(x)|$ up to any given error by exhaustively trying a discrete set of points on the interval [−1, 1] with the spacing between points dependent on the error.

Finally, item 3 is proven. The following lemma is applied: Lemma 3. Let $p(x)=\Sigma_{0 \le i \le d} a_i x^i$ be a degree-d polynomial in real variable x. Let $p_{max}=\max_{x \in [-1,1]} p(x)$. Let $a_{max}=\max_{i \ge 1} |a_i|$. Then $$p_{max} \ge a_0 + (1/6) a_1^2 / a_{max} \quad (23)$$

Remark: the factor $1/6$ in the above equation is not optimal. It can be tightened easily. Indeed, for $a_1 \ll a_{max}$, the factor $1/6$ approaches $1/2$.

Proof Consider $p(x_0)$ for $x_0 = a_1/4a_{max}$. One has $p(x_0) = a_0 + (1/4)a_{max} + \Sigma_{1 \le i \le d} a_i x_i^i$. So, $$p(x_0) \ge \quad (24)$$

$$a_0 + (1/4)a_1^2/a_{max} - \left| \sum_{2 \le i \le \infty} a_{max}(|a_1|/(4a_{max}))^i \right| \ge a_0 + (1/4)a_1^2/a_{max} -$$

$$\sum_{2 \le i \le \infty} a_{max}(|a_1|/(4a_{max}))^2 (|a_1|/(4a_{max}))^{i-2} \ge$$

$$a_0 + (1/4)a_1^2/a_{max} - a_{max}(|a_1|/(4a_{max}))^2 \sum_{2 \le i \le \infty} (1/4)^{i-2} \ge$$

$$a_0 + (1/6)a_1^2/a_{max}.$$

Define polynomial $Q(x) \equiv P(\vec{u}(x, 1, 1, \ldots, 1), \ldots, \vec{u}(x, 1, 1, \ldots, 1))$ as above. Apply lemma 3 with $a_1 = C$. If item A of theorem 1 does not hold for some given $\epsilon$, then $(1/6)C^2/a_{max} \le \epsilon C$ so $a_{max} > (1/6)(C/\epsilon)$. So for some $i \ge 1$, $|a_i| > (1/6)(C/\epsilon)$. So, $$|a_i| = \binom{K}{i} |P(\vec{w}_1, \ldots, \vec{w}_1, \vec{w}_2, \ldots, \vec{w}_2)| > (1/6)(C/\epsilon),$$

where $\vec{w}_1$ appears i times in the argument of $P(\cdot)$ and $\vec{w}_2$ appears K−i times. So, by item 1 of theorem 1, there is some choice of $\vec{u}$ with $|(\vec{u}_i)| \le 1$ for all i such that $$|P(\vec{u}, \vec{u}, \ldots, \vec{u})| \ge \frac{1}{\binom{K}{i}} \frac{K!}{K^K} (1/6)(C/\epsilon).$$

Since $$\frac{1}{\binom{K}{i}} \frac{K!}{K^K} (1/6) \ge \exp(-O(K)),$$

the result follows.
This completes the proof.

V. Classical Algorithm

The classical optimization algorithm will now be described.

Some notation that will be useful both here and in the analysis of the quantum algorithm will now be introduced.

Let one define $F_i$ (the symbol "F" is for "force", e.g., a derivative of energy with respect to some coordinate) to equal $Z_i$ times the sum of terms in $H_Z$ that include $Z_i$. For example, for K=4 and $H_Z = Z_1 Z_2 Z_3 Z_4 + Z_1 Z_3 Z_4 Z_5$ then $F_1 = Z_2 Z_2 Z_4 + Z_3 Z_4 Z_5$. The "force" depends upon the choice of $Z_i$ so one will sometimes write $F_i(\vec{Z})$ to indicate its dependence on $\vec{Z}$.

A. Some Probability Bounds

In this section, some probability bounds are collected that will be used to analyze this algorithm, as well as to analyze the classical algorithm.

---

Algorithm 1 Classical algorithm

1. Fix some real number $0 < p < 1$. Choose a set S of degrees of freedom, by including each degree of freedom in S independently with probability p.

2. Define vectorial variables $\vec{w}_1, \vec{w}_2$ as follows; the index of the vectorial variable will correspond to degrees of freedom. Let $\vec{w}_2$ be a vector with $(\vec{w}_2)_i = 0$ for $i \in S$ while for $i \notin S$ one can choose $(\vec{w}_2)_i$ to +1 or −1 independently and uniformly at random. One can choose vector $\vec{w}_1$ so that $(\vec{w}_1)_i = 0$ for $i \in S$ while for $i \in S$ one can choose $(\vec{w}_1)_i$ "greedily". That is, $(\vec{w}_1)_i = +1$ is picked if $F_1(\vec{w}_2) > 0$ and $(\vec{w}_2)_i = -1$ otherwise.

3. Finally, apply item 3 of theorem 1. By this item, for any $\epsilon > 0$, one can either find a choice of $\vec{u}$ such that $H_Z(\vec{u}) \ge H_Z(\vec{w}_2) + \epsilon C \cdot \Omega(1)$ or such that $H_Z(\vec{u}) \ge H_Z(\vec{w}_2) - C \cdot \Omega(1)/\epsilon$, where $C = \Sigma_{i \in S} |F_i|$.

By theorem 9.23 of R. O'Donnell, Analysis of boolean functions (Cambridge University Press, 2014), for any function $f$ of degree at most K from $\{-1, 1\}^N \to \mathbb{R}$ one has for any $t \geq (2e)^{K/2}$ that $$Pr_{x \in \{-1,1\}^N}\left[|f(x)| \geq t\mathbb{E}\left[|f|^2\right]^{1/2}\right] \leq \exp\left(-\frac{K}{2e}t^{2/K}\right). \quad (25)$$

By theorem 9.24 of R. O'Donnell, Analysis of boolean functions (Cambridge University Press, 2014), for any non-constant function $f$ of degree at most K from $\{-1, 1\}^N \to \mathbb{R}$, $$Pr_{x \in \{-1,1\}^N}[|f(x)| > \mathbb{E}[|f|]] \geq \frac{1}{4}\exp(-2K). \quad (26)$$

Hence, for any nonconstant function $f$ of degree at most K from $\{-1, 1\}^N \to \mathbb{R}$, by applying Eq. (26) to $f^2$, one has $$Pr_{x \in \{-1,1\}^N}[|f(x)| > \mathbb{E}[|f|^2]^{1/2}] \geq \frac{1}{4}\exp(-4K). \quad (27)$$

Applying these bounds to the force $F_i$, one finds that the average of $|F_i|$ is at least $\sqrt{D}\exp(-O(K))$. At the same time, the expectation value of $H_Z(\vec{w}_2)$ is equal to zero.

B. Analysis of Classical Algorithm

Since $|F_i| \geq \sqrt{D}\exp(-O(K))$, one finds that the constant C in the algorithm has average value at least $N\sqrt{D}\exp(-O(K))$.

The algorithm chooses either case 3A or case 3B at least half the time (or any other number $\Omega(1)$ rather than one half) and in that case, the average of $|F_i|$ must still be at least $\sqrt{D}\exp(-O(K))$. Hence, at least one of the following holds: when the algorithm chooses case 3A at least half the time and has expected $H_Z(\vec{u})$ at least $N\epsilon\sqrt{D}\exp(-O(K))$ or the algorithm chooses case 3B at least half the time and has expected $H_Z(\vec{u})$ at most $-N\sqrt{D}\exp(-O(K))/\epsilon$.

Note that for odd K, one can guarantee then expected $H_Z(\vec{U}) \geq \sqrt{D}\exp(-O(K))$ as in B. Barak, A. Moitra, R. O'Donnell, P. Raghavendra, O. Regev, D. Steurer, L. Trevisan, A. Vijayaraghavan, D. Witmer, and J. Wright, arXiv preprint arXiv:1505.03424 (2015), since one can pick $\epsilon=1$ and if case 3B occurs, one can change the sign of all variables.

Note also that while the guarantee on the classical algorithm involves the expected value of $H_Z$, since the expected value is within $1/\text{poly}(D)$ of the optimal value (which is $O(ND)$), by repeating the algorithm $\text{poly}(D)$ times one can, with probability at least one-half, obtain a solution within a constant factor of the expected value.

VI. Analysis of Quantum Algorithm

An embodiment of the quantum quench algorithm disclosed herein will now be analyzed in more detail. From Eq. (8), $$\langle \tau_T^H(H_Z) \rangle = D\frac{N - \langle \tau_T^H(X) \rangle_+}{\alpha}.$$

One can estimate $\langle \tau_T^H(X) \rangle_+$.

Consider site i. One can estimate $\langle \tau_T^H(X_i) \rangle_+$. Summing over i will give $\langle \tau_T^H(X) \rangle_+$.

The basic physical idea is that if one can ignore the time dependence of the force $F_i$, then one can approximate $\langle \tau_T^H(X_i) \rangle_+$ by the expectation value of $X_i$ assuming that the spin i evolves for a time T under a time-independent Hamiltonian. This time-independent Hamiltonian a transverse field of strength 1 (e.g., the term $X_i$ in the Hamiltonian) and to a parallel field $(\alpha/D)F_i$, where $F_i$ is the force assuming that all other spins $Z_j$ for $j \neq i$ are drawn from a uniformly random distribution (because at time T=0, the state of the system is $\psi_+$ which has equal amplitude on all states). In this case, similar to the analysis of the classical algorithm before, the force $F_i$ is likely to be at least of order $\sqrt{D}$ in which case one will have $1 - \langle \tau_T^H(X_i) \rangle_+ \sim (\alpha/D)^2 \langle F_i^2 \rangle + T^2 \sim \alpha^2 T^2/D$.

However, one cannot always neglect the time dependence of the force. To estimate whether or not the time dependence of the force is significant, one can compare the time-derivative of the force to $\sqrt{D}/T$. If the time-derivative of the force is small enough compared to $\sqrt{D}/T$, then the approximation of the above paragraph will be valid. On the other hand, if the time-derivative is not so small, one can derive a similar duality to the classical case. Indeed, one will also have some stronger results here in the case that the final state has large expectation value of X.

In subsection VIA, the time-independent case is anayzed. Subsection VIC describes a toy example where one can see the effects of time-dependence. In subsection VID, consideration is given to the errors by ignoring the time-dependence and the main results are obtained.

A. Time-Independent Force

Let one first analyze the time-independent force approximation in more detail before considering the time-dependence. One wishes to compute $$\langle \exp\left(-i\left(\frac{\alpha}{D}Z_iF_i + X_i\right)T\right)\psi_+|X_i|\exp\left(-i\left(\frac{\alpha}{D}Z_iF_i + X_i\right)T\right)\psi_+\rangle.$$

That is, consideration is given to an evolution under a Hamiltonian which includes the coupling $(\alpha/D)Z_iF_i$ and the transverse field $X_i$, but ignoring any other coupling terms which would give the remaining qubits a time-dependence in the Z-basis.

As in the analysis of the classical case, the probability that $|F_i| \geq \sqrt{D}$ is at least $\frac{1}{4}\exp(-4K)$. At the same time, by Eq. (25), the probability that $|F_i| \geq t\sqrt{D}$ for $t \geq (2e)^{K/2}$ is at most $$\exp\left(-\frac{K}{2e}t^{2/K}\right).$$

Picking t sufficiently large (for example, $t=C^{K/2}$ for sufficiently large, K-independent constant C suffices), this probability is much smaller than $\frac{1}{8}\exp(-4K)$. So, with probability at least $\frac{1}{8}\exp(-4K)$, one has $|F_i| \in [\sqrt{D}, C^{K/2}\sqrt{D}]$.

Then, for $C^{K/2}\sqrt{D}T$ sufficiently small compared to 1, for any $|F_i|$ in that interval, one has $$\langle \exp\left(-i\left(\frac{\alpha}{D}Z_iF_i + X_i\right)T\right)\psi_+|X_i|\exp\left(-i\left(\frac{\alpha}{D}Z_iF_i + X_i\right)T\right)\psi_+ \leq \quad (28)$$

$$1 - \frac{\alpha^2 T^2}{D}\exp(-O(K)).$$

Thus, if this time-independent approximation is valid (and valid for all i), one has that $$\langle \tau_T(H_Z) \rangle_+ \geq \alpha T^2 \exp(-O(K))N. \quad (29)$$

Remark: here, an upper bound on force $F_i$ was used because of the fixed time. If one averages over times on an interval, such an upper bound is not necessary.

B. Second Derivative of Expectation Value of X

One can give another approximate analysis by considering $$\partial_T^2 \langle \tau_T^H(X_i) \rangle = -\frac{\alpha^2}{D} \langle \tau_T^H(X_i F_i^2) \rangle_+ + \frac{\alpha}{D} \langle \tau_T^H(Y_i \dot{F}_i) \rangle_+, \quad (30)$$

where for any operator O, define $\dot{O} = -i[O, H]$.

For T=0 the first term is equal to $$-\frac{\alpha^2}{D}.$$

Assuming (which assumption is considered in more detail below) that the first term remains $$-\Omega(1)\frac{\alpha^2}{D},$$

then one has $$\langle \tau_T^H(X_i) \rangle = 1 - \frac{\alpha^2 T^2}{D}$$

unless the second term $$\frac{\alpha}{D} \langle \tau_T^H(Y_i \dot{F}_i) \rangle_+$$

also becomes $$\Omega(1)\frac{\alpha^2}{D}.$$

For this to happen, one needs $\langle \tau_T^H(Y_i \dot{F}_i) \rangle_+ = \Omega(1)\alpha$.

Thus, under the assumption about the first term, one has one of two situations. Either, after time T, one has $$\langle \tau_T^H(X) \rangle = N \cdot \left(1 - \Omega(1)\frac{\alpha^2 T^2}{D}\right)$$

so that $$\langle \tau_T^H(H_Z) \rangle = \Omega(1)\frac{\alpha^2 T^2}{D}$$

or one has $\Sigma_i \langle \tau_s^H(Y_i \dot{F}_i) \rangle_+ = \Omega(1)\alpha N$ for some time $s \leq T$. Further, at that time s, if one does not have $$\langle \tau_T^H(X) \rangle \geq N \cdot \left(1 - O(1)\frac{\alpha^2 T^2}{D}\right)$$

then one has $$\langle \tau_T^H(H_Z) \rangle = \Omega(1)\frac{\alpha T^2}{D}.$$

So, either the algorithm finds a state (by sampling over times $s \leq T$) with expectation value of $H_Z$ equal to $$\Omega(1)\frac{\alpha T^2}{D}$$

or for some state with expectation value of X at least $$N \cdot \left(1 - O(1)\frac{\alpha^2 T^2}{D}\right)$$

and expectation value of $\Sigma_i Y_i \dot{F}_i$ at least $\Omega(1)\alpha$. Choosing $\alpha^2 T^2 \sim D$, this yields the same guarantees as the classical algorithm for $\alpha = \sqrt{D}/\epsilon$, since using the same rounding as in the classical case, a large expectation value of $\Sigma_i Y_i \dot{F}_i$ implies one can construct a solution with a large absolute value of expectation value of $H_Z$.

For smaller $\alpha^2 T^2$, one will see that additional guarantees can be given.

C. Toy Example

The Hamiltonian of Eq. (3) provides an interesting example to study the time-dependence of the force. Defining $Z = \Sigma_i Z_i$, for the Hamiltonian (3) one has $H_Z = -\frac{1}{2}Z^2 + \text{const}$. (This constant is negative and of order N.) Hence, up to an additive constant, one has $$H = X - \frac{\alpha}{2D}Z^2 \approx X - \frac{\alpha}{2N}Z^2,$$

since D=N−1.

This system can be approximately treated as a harmonic oscillator, at least for X close to N. One can work in all eigenbasis of Z, letting state $|z\rangle$ denote an eigenstate of Z with eigenvalue z. In the large X regime, the wavefunction has most of its probability on basis states with i close to zero where the X operator is approximately equal to $(N/2)|z\rangle\langle z+1| + \text{h.c.}$. One can approximate further by treating z as a continuous variable, approximating $(N/2)|z\rangle\langle z+1| + \text{h.c.}$ by $N + (N/2)\partial_z^2$, valid in the long wavelength regime. One then gets that the Hamiltonian is equal to (ignoring additive constants) approximately equal to $$\frac{N}{2}\partial_z^2 - \frac{\alpha}{2N}z^2$$

Other than having a minus sign in front, this Hamiltonian is the familiar Hamiltonian for a harmonic oscillator. The oscillator has angular frequency $$\omega = \sqrt{\alpha}. \quad (31)$$

The z variable oscillates periodically with time at the given frequency. The force $F_i$ at time t is (in this continuum approximation) equal to z(t). Hence, if $\alpha T^2 \gtrsim 1$, then the time-dependence of the force cannot be neglected in this example. Note that here again, one can see this product $\alpha T^2$ appearing; in the time-independent analysis above (and in the previous heuristic analysis), this product controls the expectation value of $H_Z$. Thus, it is no surprise that for this toy example the time-independent approximation breaks down since there is no way to make the expectation value of $H_Z$ be large compared to N for this instance.

D. Time-Dependent Force

Define
$$\Delta_s = F_i - \tau_s^H(F_i). \tag{32}$$

One has (this hold for any state on the right-hand side, if one replaces $\psi_+$ with an arbitrary state in the next two equations):

$$\exp(-iHT)\exp\left(-i\frac{\alpha}{D}\int_0^T Z_i \Delta_s ds\right)\psi_+ = \exp(-iHT)\psi_+ + \exp(-iHT)\xi, \tag{33}$$

where the exponential is an s-ordered exponential (e.g., it is time-ordered with respected to s, are are later exponent of integrals below)

$$\xi = -i\frac{\alpha}{D}\int_0^T ds\, \exp\left(i - \frac{\alpha}{D}\int_s^T \Delta_u du\right) Z_i \Delta_s \psi_+. \tag{34}$$

So, since $$\exp\left(i - \frac{\alpha}{D}\int_s^T \Delta_u du\right)$$

is unitary, by a triangle inequality, on has $$|\xi| \leq \frac{\alpha}{D}\int_s^T ds \sqrt{\langle \Delta_s^2 \rangle_+}. \tag{35}$$

Define $$\phi(T) = \exp(-iHT)\exp\left(-i\frac{\alpha}{D}\int_0^T Z_i \Delta_s ds\right)\psi_+. \tag{36}$$

This definition of $\phi(T)$ has the following property as can be seen by going to the interaction representation.
Define operator R by
$$H = X_i + Z_i F_i + R, \tag{37}$$
so that R includes all terms in H which are not supported on site i. Then, $$\phi(T) = \exp(-iRT)\exp\left(-i\left(\frac{\alpha}{D}Z_i F_i + X_i\right)T\right)\psi_+.$$

Hence, $$\langle \phi(T)|X_i|\phi(T)\rangle = \tag{38}$$
$$\langle \exp\left(-i\left(\frac{\alpha}{D}Z_i F_i + X_i\right)T\right)\psi_+|X_i|\exp\left(-i\left(\frac{\alpha}{D}Z_i F_i + X_i\right)T\right)\psi_+.$$

Define
$$\psi_+(T) = \exp(-iTH)\psi_+. \tag{39}$$
So,
$$\phi(T) = \psi_+(T) + \xi. \tag{40}$$
Hence,
$$\langle \phi(T)|X_i|\phi(T)\rangle = \langle \tau_T(X_i)\rangle_+ + 2Re\,\langle \psi_+(T)|X_i|\xi\rangle$$
$$\langle \xi|X_i|\xi\rangle. \tag{41}$$

Let $\Pi_i^- = (1-X_i)/2$, so that it projects onto the $|-\rangle$ state on qubit i. So,
$$\langle \phi(T)|\Pi_i^-|\phi(T)\rangle = \langle \tau_T(\Pi_i^-)\rangle_+ + 2Re\,\langle \psi_+(T)|\Pi_i^-|\xi\rangle +$$
$$\langle \xi|\Pi_i^-|\xi\rangle. \tag{42}$$

By Cauchy-Schwarz, the second term in the above equation is bounded by $2\sqrt{\langle \tau_T^H(\Pi_i^-)\rangle_+}|\xi|$. The third term is bounded by $|\xi|^2$.
Hence,
$$\langle \phi(T)|\Pi_i^-|\phi(T)\rangle \leq \langle \tau_T(\Pi_i^-)\rangle_+ + 2$$
$$\sqrt{\langle \tau_T^H(\Pi_i^-)\rangle_+}|\xi| + |\xi|^2. \tag{43}$$

So,
$$\langle \tau_T^H(\Pi_i^-)\rangle_+ \geq \langle \phi(T)|\Pi_i^-|\phi(T)\rangle - 2$$
$$\sqrt{\langle \tau_T^H(\Pi_i^-)\rangle_+}|\xi| - |\xi|^2. \tag{44}$$

Thus,
$$\langle \tau_T^H(\Pi_i^-)\rangle_+ \geq \langle \phi(T)|\Pi_i^-|\phi(T)\rangle - 2$$
$$\sqrt{\langle \phi(T)|\Pi_i^-|\phi(T)\rangle}|\xi| - |\xi|^2. \tag{45}$$

So, if one can bound $|\xi|$ sufficiently small compared to $\sqrt{\langle \phi(T)|\Pi_i^-|\phi(T)\rangle}$, then one can lower bound $\langle \tau_T^H(\Pi_i^-)\rangle_+$ compared to $\langle \phi(T)|\Pi_i^-|\phi(T)\rangle$. For example, if one can bound that $|\xi| \leq \sqrt{\langle \phi(T)|\Pi_i^-|\phi(T)\rangle}/3$, then $\langle \tau_T^H(\Pi_i^-)\rangle_+ \geq \langle \phi(T)|\Pi_i^-|\phi(T)\rangle \cdot (1-2/3-1/9) = (2/9) \cdot \langle \phi(T)|\Pi_i^-|\phi(T)\rangle$. If one can give even tighter bounds on then $|\xi|$, then $\langle \tau_T^H(\Pi_i^-)\rangle_+ \to \langle \phi(T)|\Pi_i^-|\phi(T)\rangle$ as $|\xi| \to 0$.

So, one can now bound $|\xi|^2$. From Eq. (35), $$|\xi| \leq \frac{\alpha}{D}\int_0^T ds\, \sqrt{\langle \Delta_s^2\rangle_+}.$$

So, one turns to bounding $\langle \Delta_s^2\rangle_+$.
So, $\Delta_s \psi_+ = -\int_0^s dv \tau_v^H(\dot{F}_i)$, since $\Delta_0 = 0$. So, again by Cauchy-Schwarz
$$\langle \Delta_s^2\rangle_+ \leq s \int_0^s dv\, \langle |\tau_v^H(\dot{F}_i)|^2\rangle_+. \tag{46}$$
So, $$|\xi| \leq \frac{\alpha}{D}\int_0^T ds\, s\sqrt{\frac{\int_0^s dv\langle |\tau_v^H(\dot{F}_i)|^2\rangle_+}{s}}. \tag{47}$$

So, $|\xi|$ is bounded by $\alpha T^2/(2D)$ times the expectation value of $\sqrt{\langle |\tau_v^H(\dot{F}_i)|^2\rangle_+}$ for s randomly chosen in the interval $[0,T]$ from measure $(T^2/2)^-$ sds and v uniformly randomly chosen in the interval [0, s] This random choice of s followed by a random choice of v induces a measure $$d\mu(v) = 2(1-v)dv. \quad (48)$$

Thus, to have $\langle \tau_T^H(\Pi_i^-) \rangle_+ / \langle \phi(T)|\Pi_i^-|\phi(T) \rangle$ small compared to 1, given that $\langle \phi(T)|\Pi_i^-|\phi(T) \rangle$ is at least $\exp(-O(K))(\alpha^2 T^2)/D$ as shown in subsection VIA, then one needs that for random choice of v from the measure $\mu(v)$, that the expectation value $\mathbb{E}_v[\sqrt{\langle \tau_v^H(\dot{F}_i)|^2 \rangle_+}]$ is at least $$\exp(-O(K))\sqrt{\frac{\alpha^2 T^2}{D} \frac{2D}{\alpha T^2}} = \exp(-O(K))\frac{\sqrt{D}\,T}{\cdot} \quad (49)$$

Intuitively, Eq. (49) is clear: the magnitude of $\dot{F}_i$, e.g., "how quickly the force is changing in time", must be comparable to the force at time 0 (e.g., to $\sqrt{D}$) divided by the time T, in order for the force to be small at time T.

Hence, the following lemma can be developed:

Lemma 4. For $T \leq \exp(-O(K))/\sqrt{D}$, at least one of the following two possibilities holds:

1.
$$\langle \tau_T(H_Z) \rangle_+ \geq \alpha T^2 \exp(-O(K))N. \quad (50)$$

2. $\Sigma_i \mathbb{E}_v[\sqrt{\langle |\tau_v^H(\dot{F}_i)|^2 \rangle_+}]$ is at least $$\exp(-O(K))\frac{\sqrt{D}}{T}.$$

Proof. We have shown above that for each site i, if $\langle \tau_T^H(\Pi_i^-) \rangle_+ / \langle \phi(T)|\Pi_i^-|\phi(T) \rangle$ is compared to 1, then for random choice of v from the measure $\mu(v)$, that the expectation value $\mathbb{E}_v[\sqrt{\langle |\tau_v^H(\dot{F}_i)|^2 \rangle_+}]$ is at least $$\exp(-O(K))\frac{\sqrt{D}}{T}.$$

If $\langle \tau_T^H(\Pi_i^-) \rangle_+ / \langle \phi(T)|\Pi_i^-|\phi(T) \rangle$ is compared to 1 for at least half the site i, then item 2. holds while if it is small compared to 1 for fewer than half the sites then item 1. holds. □

At the time v of item 2 of lemma 4, at least one of the following holds:

$$\langle \tau_v(H_Z) \rangle \geq \alpha T^2 \exp(-O(K))N \text{ or}$$

$$\langle \tau_v(X) \rangle \geq \left(1 - \frac{\alpha^2 T^2}{D}\exp(-O(K))\right) \cdot N.$$

Hence, considering the mixed state averaged over v, these results hold in expectation.

Hence

Theorem 2. For $T \leq \exp(-O(K))/\sqrt{D}$, at least one of the following two possibilities holds: for some $s \in [0,T]$ one has that 1. Using a quench, one can produce a quantum state in polynomial times with expectation value of $H_Z \geq \alpha T^2 \exp(-O(K))N$.

2. For some state $\psi$ with $$\langle \psi|X|\psi \rangle \geq \left(1 - \frac{\alpha^2 T^2}{D}\exp(-O(K))\right).$$

N, one has that $$\sum_i \sqrt{\langle \psi||F_i|^2|\psi \rangle} \geq \exp(-O(K))\frac{\sqrt{D}\,T}{\cdot}$$

Proof. If item 1. of lemma 4 holds, then item 1. of this theorem hold by choosing s=T. If item 2. of lemma 4 holds, and $$E_v\left[\langle \tau_v(X) \rangle\right] < \left(1 - \frac{\alpha^2 T^2}{D}\exp(-O(K))\right) \cdot N,$$

then $E_v[\langle \tau_v(H_Z) \rangle] \geq \alpha T^2 \exp(-O(K))N$ and so by choosing a random v, item 1. of this theorem holds by averaging over time v. If item 2. of lemma 4 holds and $$E_v\left[\langle \tau_v(X) \rangle\right] \geq \left(1 - \frac{\alpha^2 T^2}{D}\exp(-O(K))\right) \cdot N,$$

then the mixed state averaged over time t obeys the conditions of item 2. and so some pure state will obey the conditions also. □

This state $\psi$ of item 2 has the property that $$\sum_i \sqrt{\langle \psi||\dot{F}_i|^2|\psi \rangle} \geq \exp(-O(K))\frac{\sqrt{D}}{T}.$$

One can use this state $\psi$ to construct another state which has a large expectation value for the absolute value of $H_Z$; similar to the classical rounding, this large expectation value may be very negative rather than very positive. An additional ingredient, discussed in subsection VIE is the interesting regime with a large expectation value of X where additional bounds can be derived.

To do this, one can pick a random set of sites, called S. One can include each site in this set with probability ½, choosing independently for each site whether or not it is in S. Note that $\dot{F}_i$ is a degree-(K−1) polynomial. Each term in the polynomial is degree K−2 in Pauli Z-variable and degree 1 in Pauli Y variables. Define $F_i^S$ to include only the terms in the polynomial which do not include sites in S. The basic idea (we will give this in more detail below) is to choose $Y_i$ for $i \in S$ to be proportional to $F_i^S$; with the constant of proportionality chosen to have $$\langle X_i \rangle \geq 1 - \frac{\alpha^2 T^2}{2D}\exp(-O(K))$$

for $i \in S$.

In expectation over choices of S, one has $$\sum_{i \in S} \sqrt{\langle \psi | |\dot{F}_i^{\bar{S}}|^2 |\psi\rangle} \geq \exp(-O(K))\frac{\sqrt{D}}{T}. \qquad 5$$

So, indeed for some choice of S this holds. Let $\rho$ be the mixed state obtained by tracing out sites in S for such a choice. Let $\sigma_S^+$ be the density matrix on S with all spins polarized in the + direction. Consider the state $$\tau \equiv \exp\left(ic \sum_{i \in S} \dot{F}_i^{\bar{S}} Z_i\right) (\rho \otimes \sigma_S^+) \exp\left(-ic \sum_{i \in S} \dot{F}_i^{\bar{S}} Z_i\right),$$

where c is a constant chosen below.

So long as $c\dot{F}_i^{\bar{S}} = O(1)$, one can find that $\text{tr}(\tau X_i) \geq 1 - O(c^2) \text{tr}(\rho |\dot{F}_i^{\bar{S}}|^2)$ and that $\text{tr}(\tau \Sigma_{i \in S} \geq c\text{tr}(\rho |\dot{F}_i^{\bar{S}}|^2)$. Suppose for the moment that $$\sum_{i \in S} \sqrt{\langle \psi | |\dot{F}_i^{\bar{S}}|^2 |\psi\rangle} = \exp(-O(K))\frac{\sqrt{D}}{T}. \qquad 25$$

That is, a lower bound on the left-hand side was previously assumed, but now one can assume equality. Then, for $c = (\alpha T^2)/D$, one has $$tr\left(\tau \sum_{i \in S} Y_i \dot{F}_i^{\bar{S}}\right) \geq \alpha \exp(-O(K)). \qquad (51)$$

Also, $$tr(\tau X_i) \geq 1 - O\left(\frac{\alpha^2 T^2}{D}\right). \qquad (52)$$

Now, if it turns out that instead $\Sigma_{i \in S} \sqrt{\langle \psi | |\dot{F}_i^{\bar{S}}|^2 |\psi\rangle}$ is significantly larger than $$\exp(-O(K))\frac{\sqrt{D}}{T},$$

one can instead reduce c proportionally and still obtain a state obeying Eqs. (51,52).

So, one finds that

Theorem 3. For $T \leq \exp(-O(K))/\sqrt{D}$, at least one of the following two possibilities holds: for some $s \in [0,T]$ one has that 1. Using a quench one can produce a quantum state in polynomial times with expectation value of $H_Z \geq \alpha T^2 \exp((-O(K))N$.

2. For some state $\psi$ with $$\langle \psi | X | \psi \rangle \geq \left(1 - \frac{\alpha^2 T^2}{D} \exp(-O(K))\right).$$

N, one has that $$\left|\sum_{i \in S} \langle \psi | X_i \dot{F}_i | \psi \rangle\right| \geq \exp(-O(K))\alpha N.$$

For the case $\alpha^2 T^2/D = 1$, applying the same rounding as in the classical case to item 2, one finds the same duality as in the classical case, for $\alpha T^2 = \epsilon\sqrt{D}$ and $\alpha = \sqrt{D}/\epsilon$.

In the next subsection, additional guarantees present in the quantum algorithm when $\alpha^2 T^2/D \ll 1$ are explored.

Further, one can consider the expectation value of higher moments of $\tau_v(X)$. The reason for considering this is explained later. The time evolution conserves the quantity $$H + X + \frac{\alpha}{D} H_Z,$$

but it also conserves all moments of this quantity. Note that in the state $\psi_+$ one has $\langle (H-N)^2 \rangle_+ = (\alpha^2/D^2) \langle H_Z^2 \rangle_+ = (\alpha^2/D^2) N\alpha^2/(DK)$. Hence, $\langle \tau_T^H(H-N^2) \rangle_+ = N\alpha^2/(DK)$. By Cauchy-Schwarz, $$\langle \tau_T^H((H-N)^2) \rangle_+ = \qquad (53)$$

$$\langle \tau_T^H((X-N)^2) \rangle_+ + 2\frac{\alpha}{D} \langle \tau_T^H((X-N)H_Z) \rangle_+ \frac{\alpha^2}{D^2} \langle \tau_T^H(H_Z^2) \rangle_+ \geq$$

$$\langle \tau_T^H((X-N)^2) \rangle_+ + \langle \tau_T^H(H_Z^2) \rangle_+ - 2\sqrt{\langle \tau_T^H(H_Z^2) \rangle_+ \langle \tau_T^H((X-N)^2) \rangle_+}.$$

Hence, $$\sqrt{\langle \tau_T^H(H_Z^2) \rangle_+} \geq \frac{D}{\alpha} \sqrt{\langle \tau_T^H((X-N)^2) \rangle_+} + \sqrt{N_T}. \qquad (54)$$

Hence, one has related flucutations in X−N to fluctuations in H. If it is the case that with probability at most $(\alpha T^2/D)^2$ that $\tau_T^H(H_Z)$ is measured to be greater than $\alpha T^2 N$, then since $\|H_Z\| \leq DN$, it follows that $\sqrt{\langle \tau_T^H(H_Z^2) \rangle_+} = O(\alpha T^2 N)$, and so $$\sqrt{\langle \tau_T^H((X-N)^2) \rangle_+} = O\left(\frac{\alpha^2 T^2}{D} N + \frac{\alpha}{D} \sqrt{N_T}\right). \qquad (55)$$

In the limit of large N, the quantity $\sqrt{N_T}$ is asymptotically only $\sqrt{N}$ and so is negligible compared to the leading term.

E. Large X Expectation Value in Duality

The quantum algorithm when $\alpha^2 T^2/D \ll 1$ is now considered, e.g., when the expectation value of X in item 2 is close to 1.

First, a simple mean-field treatment is given: consider some Hamiltonian of degree K that will be called $H_0$ that is diagonal in the Z-basis. Suppose one wishes to maximize the expectation value of $H_0$ over states with given expectation value of X. If no constraint were placed on the expectation value of X, then one can maximize $H_Z$ by choosing some state in the computational basis. For each spin i, this state has some expectation value $\langle Z_i \rangle = z_i$ with $z_i \in \{-1, +1\}$. If one wishes to obtain a nonzero expectation value of X, then a simple way is to take a product state, where each spin has z,142 $X_i\rangle = \cos(\theta)$ and $\langle Z_i\rangle = z_i \sin(\theta)$, for some angle $\theta$. For $\theta = \pi/2$, one can recover the classical state. At small $\theta$, the expectation value of $H_0$ is proportional to $\theta^K$, while the expectation value of $1-X_i$ is proportional to $\theta^2$. Thus, for $K>2$, the expectation value of $H_0$ drops more rapidly as a function of $\theta$ than does the expectation value of $1-X_i$.

A similar mean-field treatment might be applied to a Hamiltonian $H_0$ that includes both Y and Z operators: given any product solution of $H_0$ with $\langle Z_i\rangle = z_i$ and $\langle Y_i\rangle = y_i$ with $z_i^2 + y_i^2 = 1$, one can define a product state with $\langle X_i\rangle = \cos(\theta)$ and $\langle Z_i\rangle = z_i \sin(\theta)$ and $\langle Y_i\rangle = y_i \sin(\theta)$.

If this mean-field procedure were the best possible then, combined with theorem 3 taking $H_0$ to be the Hamiltonian of item 2, one would have a very favorable situation for the quantum algorithm: one would have (for small $\theta$) the scaling $\theta^2 \sim \alpha^2 T^2/D$ and while the expectation value of $H_0$ would be at most $\theta^K$ times the optimal value of $H_0$. Call this optimal value $H_0^{max}$. Then for case 2 to apply, one would need $\alpha \sim \theta^K H_0^{max}$ while $\alpha^2 T^2/D \sim \theta^2$. So one would have $(\alpha T^2) \sim D\theta^{2-K}/H_0^{max}$. Taking, at the most optimistic situation, $\theta \sim 1/\sqrt{D}$ (since for smaller $\theta$ the expectation value of $X_i$ is within $1/D$ of 1 and certainly the mean-field is not accurate here), one would find that case 1 holds unless $H_0^{max} \sim N(\alpha T^2)^{-1} D^{K/2}$. For the case $K=2$, this is the same guarantee as before, but for $K=4$ or larger, this is much stronger guarantee.

This mean-field procedure will break down, so one cannot give such a strong guarantee for the quantum algorithm. However, in this subsection, it will be shown that some guarantees are still present in the quantum algorithm. These guarantees are expressed in terms of a semi-definite programming optimization problem.

Here, the case $K=4$ for definiteness is fixed from now on. Also, consider from here on the dense case, where $N_T \sim N^K$. The semi-definite programming problem that is given will still be relevant even if the dense case is not considered; however, in the dense case some additional interesting bounds can be given.

The dense case was studied previously, where it was shown that one can in general improve upon a random assignment by an amount proportional to $\sqrt{N_T}$. For $K=4$, this means that one can achieve $\langle H^Z\rangle \sim N^2$ in the worst case. This is interesting as the problem has degree $D \sim N^3$ and so the improvement over random even in the worst case is by much more than $N_T/D$.

In fact, the classical algorithm above will typically also achieve a value at least proportional to $N^2$ for all instances. To see this, note that in case 3 of theorem 1, the polynomial $p(x)$ in the proof will have coefficient $a_1$ of order $N\sqrt{D}$ but the second order coefficient $a_2$ will be much smaller than $N$ $D$. Indeed, for any given pair of sites $i, j \in S$, the coefficient of $(\vec{w}_1)_i(\vec{w}_1)_j$ will be a weighted sum of terms $(\vec{w}_2)_k(\vec{w}_2)_l$ for $k, l \notin S$. While there are $N^2$ terms in the sum, for random choice of $\vec{w}_2$, the magnitude of this term will typically only be of order $N$. So, one will typically have $a_2$ of order $N^2$. Similar bounds can be given on higher degree coefficients of the poynomial. So, for $x \sim a_1/|a_2|$, one will have $p(x) \sim a_1^2/a_2 \sim N D/N^2 \sim N^2$ as claimed.

The quantum algorithm will also typically achieve a value at least proportional to $N^2$ for all instances. To see this, consider any Hamiltonian $H_0$ which is a sum of terms of degree K, all with coefficient +1. Assume that $H_0$ is diagonal in the Z basis (a similar calculation arises for any $H_0$ which includes terms in both Y and Z basis). It is desirable to optimize $H_0$ at given expectation value of X. One can claim that for any such choice of $H_0$, the optimum is bounded by the optimum where all coefficients in $H_0$ are +1. To see this, work in an eigenbasis of $X_i$. Then, $H_0$ becomes an off-diagonal operator; for any wavefunction optimizing any given choice of $H_0$, if one takes the absolute value of that wavefunction (e.g., in the eigenbasis of $X_i$, one replaces each coefficient with its absolute value), one obtains at least as large an eigenvalue for the case where all coefficients are +1. Indeed, one obtains at least as large a value if one assumes that all coefficients are +1 and non-vanishing. However, if all coefficients in $H_0$ are +1, this is a soluble problem: one must optimize $X+Z^4$. Optimizing this when the expectation value of X is $N-1$, one finds that the optimum is $\sim N^2$. This indeed is what one expects from mean-field theory for this problem. Note that here rather than taking expectation value of $1-X_i \sim 1/D$, one instead takes the expectation value of $1-X_i \sim 1/N$ in the dense case.

At this point a slight change of notation makes things clearer in the dense case. Let one define $\beta$ so that $$\frac{\beta}{\sqrt{N_T}} = \frac{\alpha}{D}.$$

Then, one can find that case 2 of theorem 2 has expectation value $N-X$ of order $\beta^2 T^2$, while the expectation value of $H_0$ is of order $\beta\sqrt{N_T}$ and in case 1 the expectation value of $H_Z$ is of order $\beta T^2\sqrt{N_T}$. Choosing $\beta^2 T^2 = 1$ and choosing $\beta$ slightly larger than 1, one sees that case 2 cannot then occur so case 1 must occur so indeed one gets an expectation value of $H_Z$ of order $\sqrt{N_T}$.

Now, more general instances are considered and a bound is given on the expectation value of $H_0$ in general.

First, the case of $K=2$ is considered simply to fix notation and the general framework is given. The case of $k=4$ is then considered. It should be understood that generalization to higher cases is possible and within the scope of the disclosed technology.

For each site i, define operator $b_i^\dagger = (|-\rangle\langle+|)_i$. That is, it has a nonzero matrix element only from the $|+\rangle$ state on i to the $|-\rangle$ state. One has $b_i b_i^\dagger = (1+X_i)/2$ and $b_i^\dagger b_i = (1-X_i)/2$. For any quantum state (possibly mixed) $\rho$ define a 2N-by-2N matrix M of correlation functions. This matrix will have a block form $$M = \begin{pmatrix} M_{++} & M_{+-} \\ M_{-+} & M_{--} \end{pmatrix}, \quad (56)$$

where $M_{++}$ has matrix elements $$(M_{++})_{ij} = tr(\rho b_i^\dagger b_j), \quad (57)$$

and $M_{+-}$ has matrix elements $$(M_{+-})_{ij} = tr(\rho b_i b_j), \quad (58)$$

$M_{--}$ has matrix elements $$(M_{--})_{ij} = tr(\rho b_i b_j^\dagger). \quad (59)$$

One can set $M_{+-} = M_{-+}^\dagger$ and the matrix $M_{++}$ and $M_{--}$ are Hermitian. Note then that the off-diagonal elements of $M_{++}$ and $M_{--}$ are related by $$(M_{++})_{ij} = -(M_{--})_{ij}$$

for $i \neq j$ but $$(M_{++})_{ii} = 1 - (M_{--})_{ii}.$$

Equivalently, given an 2N component vector $\vec{a}$, one can define an operator $O(\vec{a})$ by $$O(\vec{a}) = \sum_{i=1}^{N} b_i^\dagger a_i + \sum_{i=1}^{N} b_i a_{i+N}.$$

Then, M is such that $$tr(\rho O(\vec{a}_1)^\dagger O(\vec{a}_2)) = \vec{a}_1^\dagger \cdot M \cdot \vec{a}_2. \quad (60)$$

So, M is the matrix of correlations functions of a 2N component vector containing operators $b^\dagger$ and b.

Then, since for any $\vec{a}$ and any $\rho$, one has $tr(\rho O(\vec{a})^\dagger O(\vec{a})) \geq 0$, it follows that M is a positive semi-definite matrix. Further, one has $$tr(M_{++}) = tr\left(\rho \frac{N-X}{2}\right). \quad (61)$$

One can construct a similar semi-definite programming bound in the case K=4 or larger. Now one can construct a matrix M which is a $(2N)^{K/2}$-by-$(2N)^{K/2}$) matrix. Let one focus on the case K=4. To define this matrix M, given any $(2N)^2$ component vector $\vec{a}$, label the components by a pair (i, j) each ranging from 1 to 2N. Then define $$O(\vec{a}) = \sum_{i=1}^{N} \sum_{j=1}^{N} (\vec{a}_{i,j} b_i^\dagger b_j^\dagger + \vec{a}_{i+N,j} b_i^\dagger b_j^\dagger + \vec{a}_{i,j+N} b_i^\dagger b_j^\dagger + \vec{a}_{i+N,j+N} b_i^\dagger b_j^\dagger).$$

Again the matrix M is positive semi-definite. One can again write M with a block structure $$M = \begin{pmatrix} M_{++;++} & M_{++;+-} & M_{++;-+} & M_{++;--} \\ M_{+-;++} & M_{+-;+-} & M_{+-;-+} & M_{+-;--} \\ M_{-+;++} & M_{-+;+-} & M_{-+;-+} & M_{-+;--} \\ M_{--;++} & M_{--;+-} & M_{--;-+} & M_{--;--} \end{pmatrix}. \quad (62)$$

The diagonal entries of M can be bounded in terms of the second moment of N–X This gives a semi-definite programming relaxation that allows one to bound the expectation value of $H_0$ at large X.

VII. Discussion

The embodiments disclosed include an algorithm that uses quantum quenches as well as a classical algorithm to perform approximate optimization. It was also proven that both of these algorithms obtain a result that improves upon the random appraoch by an amount that is more than N/D unless a related problem has a "very bad" solution. This can be used then in some cases to guarantee that the algorithm will find a nontrivial improvement if no such solution of the related problem exists. Additional guarantees can be given for the quantum algorithm.

The example quench algorithm is not described by a fixed depth quantum circuit, independent of D. The Lieb-Robinson velocity $v_{LR}$ of this Hamiltonian is proportional to $\sqrt{\alpha}$, as can be shown by using Lieb-Robinson bounds adapted to Hamiltonians where the Hamiltonians is a sum of two types of terms (in this case, $X_j$ for different qubits j is one type and terms in $H_Z$ is another type) such that terms within a type commute; more generally, one can use bounds adapted to the case of a bounded commutator. To define the Lieb-Robinson velocity, one can define a distance between qubits by using a graph metric for a graph with vertices corresponding to qubits and an edge between vertices if the corresponding qubits are both in some term in $H_Z$.

The estimates using the Lieb-Robinson velocity give some upper bound on how far a perturbation can propagate in a given time; the effect of a perturbation beyond a distance proportional to $v_{LR}t$ is negligible. These estimates may not be tight, but it is to be expected that indeed the velocity of perturbations will be proportional to $\sqrt{\alpha}$ in many systems. If this is true, then if $\alpha t^2$ diverges with D to obtain a nontrivial approximation, the necessary circuit depth also diverges.

VIII. General Embodiments

In this section, example methods for performing aspects of the disclosed embodiments are disclosed. The particular embodiments described should not be construed as limiting, as the disclosed method acts can be performed alone, in different orders, or at least partially simultaneously with one another. Further, any of the disclosed methods or method acts can be performed with any other methods or method acts disclosed herein.

Figure 5:
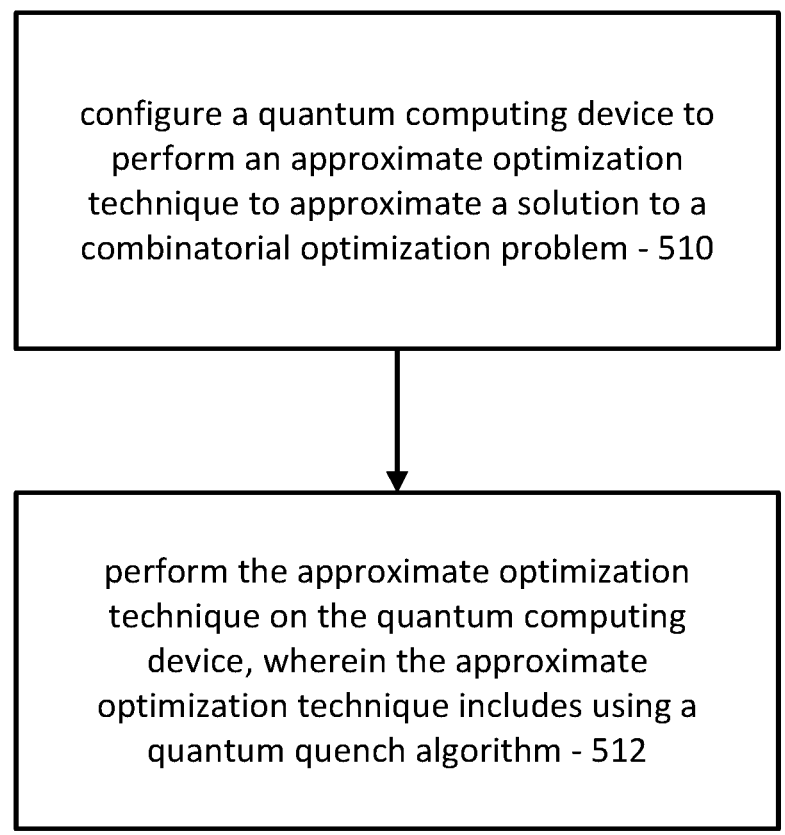
FIG. 5 is an example method for performing an approximate optimization technique using a quantum quench algorithm as disclosed herein.

FIG. 5 is an example method for performing an approximate optimization technique using a quantum quench algorithm as disclosed herein.

At 510, a quantum computing device is configured to perform an approximate optimization technique to approximate a solution to a combinatorial optimization problem.

At 512, the approximate optimization technique is performed on the quantum computing device, wherein the approximate optimization technique includes using a quantum quench algorithm.

In certain implementations, the quench algorithm includes averaging state values over a plurality of times. In particular implementations, the controlling comprises changing coupling constants without using a jump or slow change in the coupling constants. In some examples, the changing of the coupling constants is performed non-adiabatically. In certain examples, the changing of the coupling constants is followed by an equilibration time.

In some implementations, the method further comprises reading out results of the approximate optimization technique from the quantum computing device; and storing the results in a classical computing device.

FIG. 6 is another example method for performing an approximate optimization technique using a quantum quench algorithm as disclosed herein.

At 610, a quantum quench algorithm is performed on a classical computing device using simulation of a quantum Hamiltonian to perform approximate optimization. In certain implementations, the quench algorithm includes averaging state values over a plurality of times.

IX. Example Computing Environments

FIG. 1 illustrates a generalized example of a suitable classical computing environment 100 in which several of the described embodiments can be implemented. The computing environment 100 is not intended to suggest any limitation as to the scope of use or functionality of the disclosed technology, as the techniques and tools described herein can be implemented in diverse general-purpose or special-purpose environments that have computing hardware.

With reference to FIG. 1, the computing environment 100 includes at least one processing device 110 and memory 120. In FIG. 1, this most basic configuration 130 is included within a dashed line. The processing device 110 (e.g., a CPU or microprocessor) executes computer-executable instructions. In a multi-processing system, multiple processing devices execute computer-executable instructions to increase processing power. The memory 120 may be volatile memory (e.g., registers, cache, RAM, DRAM, SRAM), non-volatile memory (e.g., ROM, EEPROM, flash memory), or some combination of the two. The memory 120 stores software 180 implementing tools for peforming any of the approximation methods disclosed herein for addressing combinatorial optimization problems, using a classical computer and/or quantum computer. For example, the memory 120 can store software for controlling a quantum circuit to implement an embodiment of the disclosed approximation technique. The memory 120 can also store software 180 for synthesizing, generating (or compiling), and/or controlling quantum circuits as described herein.

The computing environment can have additional features. For example, the computing environment 100 includes storage 140, one or more input devices 150, one or more output devices 160, and one or more communication connections 170. An interconnection mechanism (not shown), such as a bus, controller, or network, interconnects the components of the computing environment 100. Typically, operating system software (not shown) provides an operating environment for other software executing in the computing environment 100, and coordinates activities of the components of the computing environment 100.

The storage 140 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 100. The storage 140 can also store instructions for the software 180 implementing tools for peforming any of the approximation methods disclosed herein for addressing combinatorial optimization problems, using a classical computer and/or quantum computer. For example, the memory 120 can store software for controlling a quantum circuit to implement an embodiment of the disclosed approximation technique. The storage 140 can also store instructions for the software 180 for synthesizing, generating (or compiling), and/or controlling quantum circuits as described herein.

The input device(s) 150 can be a touch input device such as a keyboard, touchscreen, mouse, pen, trackball, a voice input device, a scanning device, or another device that provides input to the computing environment 100. The output device(s) 160 can be a display device (e.g., a computer monitor, laptop display, smartphone display, tablet display, netbook display, or touchscreen), printer, speaker, or another device that provides output from the computing environment 100.

The communication connection(s) 170 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods, quantum circuit control techqniues, or compilation/synthesis techniques can be described in the general context of computer readable instructions stored on one or more computer-readable media. Computer-readable media are any available media (e.g., memory or storage device) that can be accessed within or by a computing environment. Computer-readable media include tangible computer-readable memory or storage devices such as memory 120 and/or storage 140, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 2:
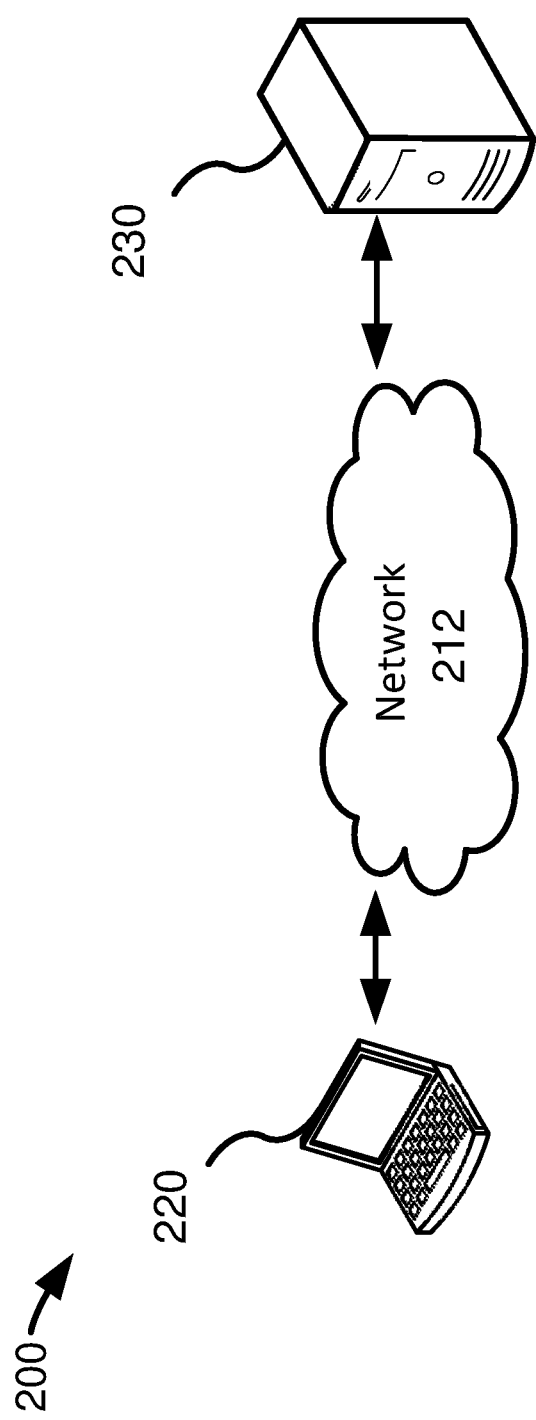
FIG. 2 is an example of a possible network topology (e.g., a client-server network) for implementing a system according to the disclosed technology.

An example of a possible network topology 200 (e.g., a client-server network) for implementing a system according to the disclosed technology is depicted in FIG. 2. Networked computing device 220 can be, for example, a computer running a browser or other software connected to a network 212. The computing device 220 can have a computer architecture as shown in FIG. 1 and discussed above. The computing device 220 is not limited to a traditional personal computer but can comprise other computing hardware configured to connect to and communicate with a network 212 (e.g., smart phones, laptop computers, tablet computers, or other mobile computing devices, servers, network devices, dedicated devices, and the like). Further, the computing device 220 can comprise an FPGA or other programmable logic device. In the illustrated embodiment, the computing device 220 is configured to communicate with a computing device 230 (e.g., a remote server, such as a server in a cloud computing environment) via a network 212. In the illustrated embodiment, the computing device 220 is configured to transmit input data to the computing device 230, and the computing device 230 is configured to implement a quantum circuit control technique according to any of the disclosed embodiments and/or a circuit generation or compilation/synthesis methods for generating qunatum circuits for use with any of the techniques disclosed herein. The computing device 230 can output results to the computing device 220. Any of the data received from the computing device 230 can be stored or displayed on the computing device 220 (e.g., displayed as data on a graphical user interface or web page at the computing devices 220). In the illustrated embodiment, the illustrated network 212 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 212 can be the Internet or a similar public network and operate using an appropriate protocol (e.g., the HTTP protocol).

Figure 3:
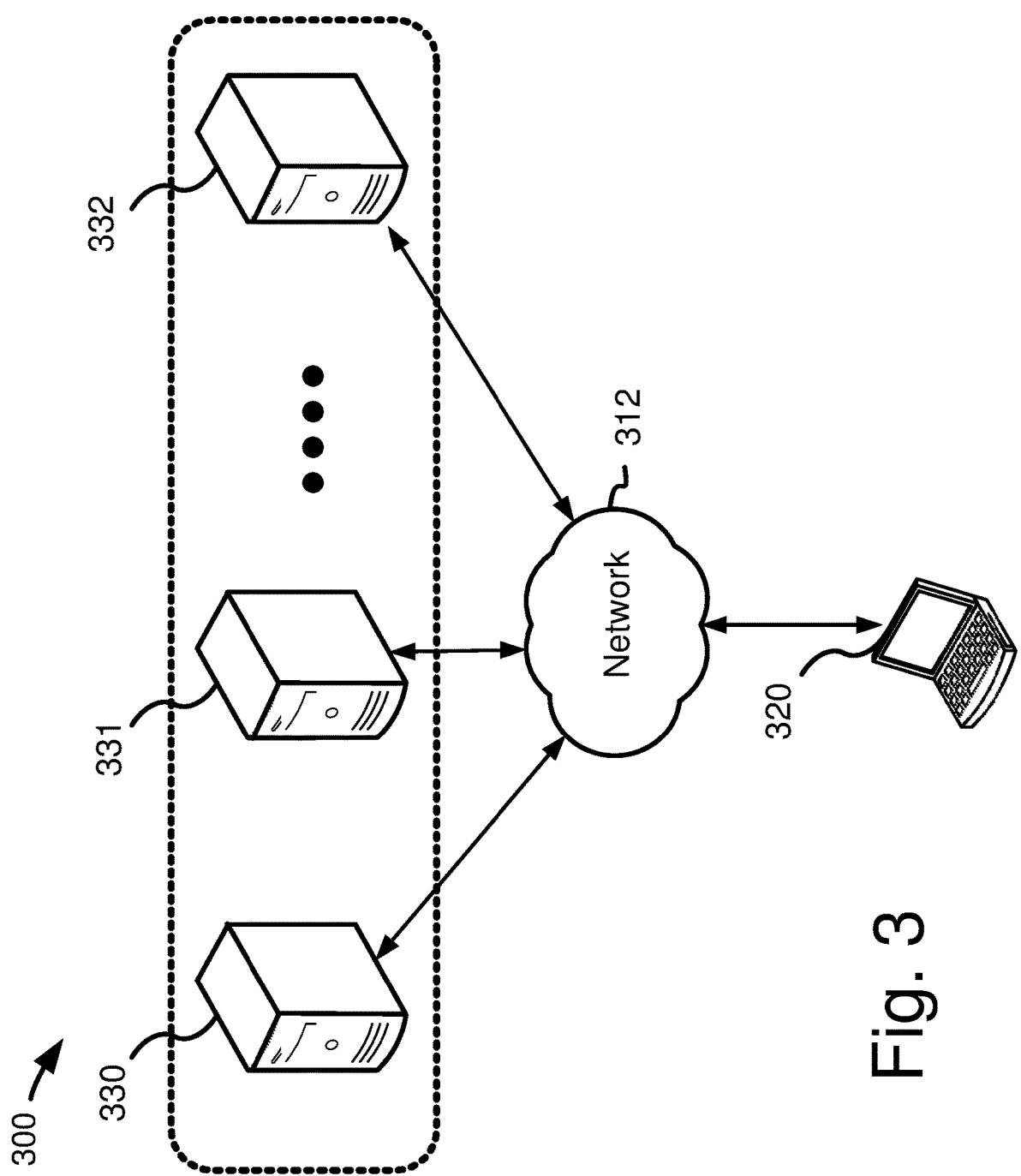
FIG. 3 is another example of a possible network topology (e.g., a distributed computing environment) for implementing a system according to the disclosed technology.

Another example of a possible network topology 300 (e.g., a distributed computing environment) for implementing a system according to the disclosed technology is depicted in FIG. 3. Networked computing device 320 can be, for example, a computer running a browser or other software connected to a network 312. The computing device 320 can have a computer architecture as shown in FIG. 1 and discussed above. In the illustrated embodiment, the computing device 320 is configured to communicate with multiple computing devices 330, 331, 332 (e.g., remote servers or other distributed computing devices, such as one or more servers in a cloud computing environment) via the network 312. In the illustrated embodiment, each of the computing devices 330, 331, 332 in the computing environment 300 is used to perform at least a portion of a quantum circuit control technique according to any of the disclosed embodiments and/or a circuit generation or compilation/synthesis methods for generating quantum circuits for use with any of the techniques disclosed herein. In other words, the computing devices 330, 331, 332 form a distributed computing environment in which the quantum circuit control and/or generation/compilation/synthesis processes are shared across multiple computing devices. The computing device 320 is configured to transmit input data to the computing devices 330, 331, 332, which are configured to distributively implement such as process, including performance of any of the disclosed methods or creation of any of the disclosed circuits, and to provide results to the computing device 320. Any of the data received from the computing devices 330, 331, 332 can be stored or displayed on the computing device 320 (e.g., displayed as data on a graphical user interface or web page at the computing devices 320). The illustrated network 312 can be any of the networks discussed above with respect to FIG. 2.

Figure 4:
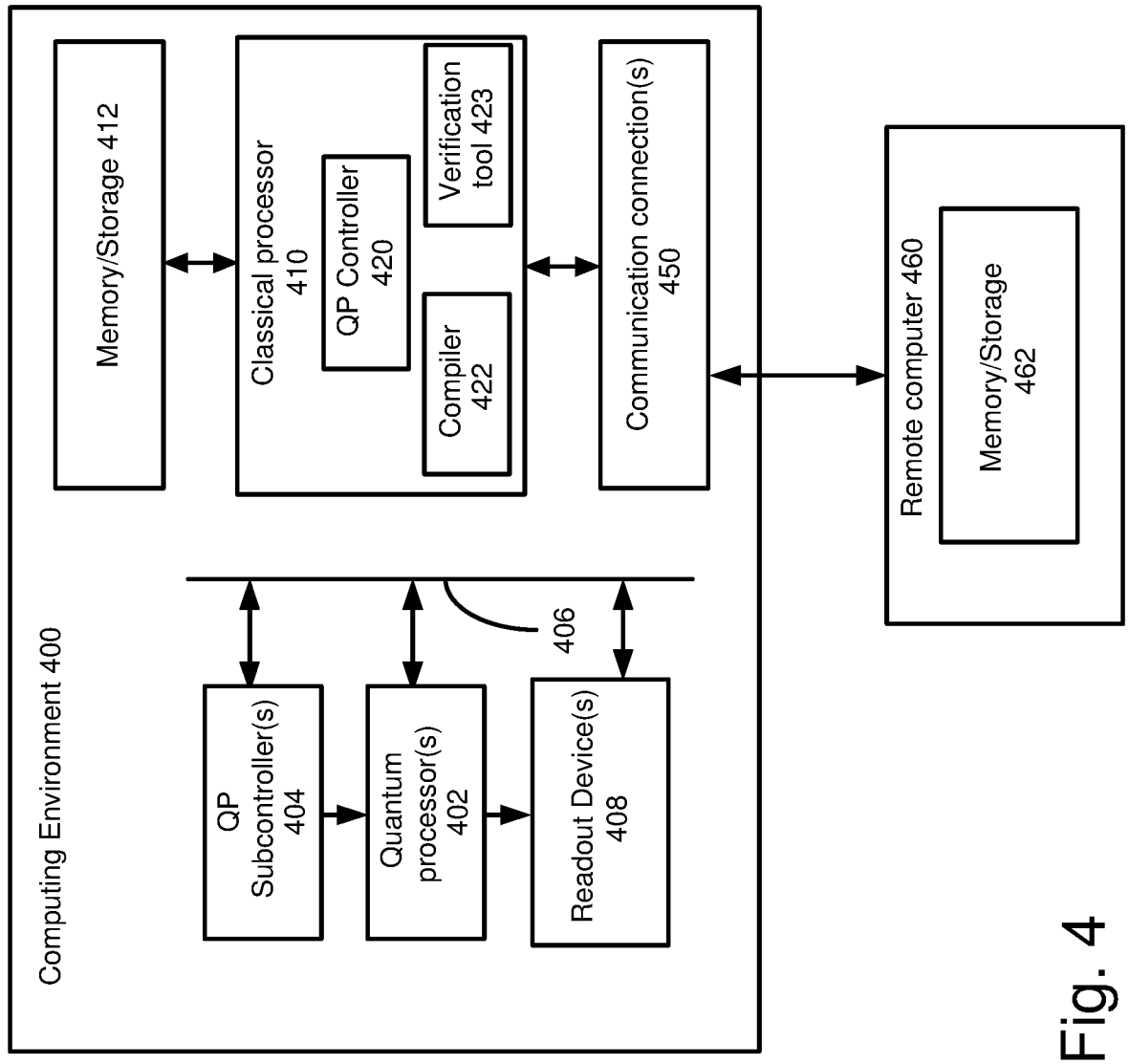
FIG. 4 is an exemplary system for implementing the disclosed technology.

With reference to FIG. 4, an exemplary system for implementing the disclosed technology includes computing environment 400. In computing environment 400, a compiled quantum computer circuit description (including quantum circuits for performing any of the disclosed approximation techniques) can be used to program (or configure) one or more quantum processing units such that the quantum processing unit(s) implement the circuit described by the quantum computer circuit description.

The environment 400 includes one or more quantum processing units 402 and one or more readout device(s) 408. The quantum processing unit(s) execute quantum circuits that are precompiled and described by the quantum computer circuit description. The quantum processing unit(s) can be one or more of, but are not limited to: (a) superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 406 at the control of quantum processor controller 420. The quantum processor controller (QP controller) 420 can operate in conjunction with a classical processor 410 (e.g., having an architecture as described above with respect to FIG. 1) to implement the desired quantum computing process. In the illustrated example, the QP controller 420 further implements the desired quantum computing process via one or more QP subcontrollers 404 that are specially adapted to control a corresponding one of the quantum processor(s) 402. For instance, in one example, the quantum controller 420 facilitates implementation of the compiled quantum circuit by sending instructions to one or more memories (e.g.; lower-temperature memories), which then pass the instructions to low-temperature control. unit(s) (e.g., QP subcontroller(s) 404) that transmit, for instance, pulse sequences representing the gates to the quantum processing unit(s) 402 for implementation. In other examples, the QP controller(s) 420 and QP subcontroller(s) 404 operate to provide appropriate magnetic fields, encoded operations, or other such control signals to the quantum processor(s) to implement the operations of the compiled quantum computer circuit description. The quantum controller(s) can further interact with readout devices 408 to help control and implement the desired quantum computing process (e.g., by reading or measuring out data results from the quantum processing units once available, etc.)

With reference to FIG. 4, compilation is the process of translating a high-level description of a quantum algorithm into a quantum computer circuit description comprising a sequence of quantum operations or gates, which can include the circuits as disclosed herein. The compilation can be performed by a compiler 422 using a classical processor 410 (e.g., as shown in FIG. 1) of the environment 400 which loads the high-level description from memory or storage devices 412 and stores the resulting quantum computer circuit description in the memory or storage devices 412.

In other embodiments, compilation and/or verification can be performed remotely by a remote computer 460 (e.g., a computer having a computing environment as described above with respect to FIG. 1) which stores the resulting quantum computer circuit description in one or more memory or storage devices 462 and transmits the quantum computer circuit description to the computing environment 400 for implementation in the quantum processing unit(s) 402. Still further, the remote computer 400 can store the high-level description in the memory or storage devices 462 and transmit the high-level description to the computing environment 400 for compilation and use with the quantum processor(s). In any of these scenarios, results from the computation performed by the quantum processor(s) can be communicated to the remote computer after and/or during the computation process. Still further, the remote computer can communicate with the QP controller(s) 420 such that the quantum computing process (including any compilation, verification, and QP control procedures) can be remotely controlled by the remote computer 400. In general, the remote computer 460 communicates with the QP controller(s) 420, compiler/synthesizer 422, and/or verification tool 423 via communication connections 450.

In particular embodiments, the environment 400 can be a cloud computing environment, which provides the quantum processing resources of the environment 400 to one or more remote computers (such as remote computer 460) over a suitable network (which can include the internet).

X. Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

What is claimed is:

1. A method, comprising:
configuring a quantum computing device to perform an approximate optimization technique to approximate a solution to a combinatorial optimization problem; and
performing the approximate optimization technique on the quantum computing device,
wherein the approximate optimization technique includes using a quantum quench algorithm.

2. The method of claim 1, wherein the quench algorithm includes averaging state values over a plurality of times.

3. The method of claim 1, wherein the approximate optimization technique comprises:
changing coupling constants without using a jump or slow change in the coupling constants.

4. The method of claim 3, wherein the changing coupling constants is performed non-adiabatically.

5. The method of claim 3, wherein the changing of the coupling constants is followed by an equilibration time.

6. The method of claim 1, further comprising:
reading out results of the approximate optimization technique from the quantum computing device; and
storing the results in a classical computing device.

7. A system, comprising:
a classical computer; and
a quantum computer,
wherein the quantum computing device is configured to perform an approximate optimization technique on the quantum computing device to approximate a solution to a combinatorial optimization problem,
wherein the approximate optimization technique includes using a quantum quench algorithm.

8. The system of claim 7, wherein the quench algorithm includes averaging state values over a plurality of times.

9. The system of claim 7, wherein the approximate optimization technique comprises changing coupling constants without using a jump or slow change in the coupling constants.

10. The system of claim 9, wherein the changing coupling constants is performed non-adiabatically.

11. The system of claim 9, wherein the changing of the coupling constants is followed by an equilibration time.

12. The system of claim 9, wherein the classical computer is further configured to:
read out results of the approximate optimization technique from the quantum computing device; and
store the results in a classical computing device.

13. One or more computer-readable media storing computer-executable instructions, which when executed by a classical computing device, cause the classical computing device to perform a method, the method comprising:
configuring a quantum computing device to perform an approximate optimization technique to approximate a solution to a combinatorial optimization problem; and
performing the approximate optimization technique on the quantum computing device,
wherein the approximate optimization technique includes using a quantum quench algorithm.

14. The one or more computer-readable media of claim 13, wherein the quench algorithm includes averaging state values over a plurality of times.

15. The one or more computer-readable media of claim 13, wherein the approximate optimization technique comprises:
changing coupling constants without using a jump or slow change in the coupling constants.

16. The one or more computer-readable media of claim 15, wherein the changing coupling constants is performed non-adiabatically.

17. The one or more computer-readable media of claim 15, wherein the changing of the coupling constants is followed by an equilibration time.

18. The one or more computer-readable media of claim 13, further comprising:
reading out results of the approximate optimization technique from the quantum computing device; and
storing the results.

19. A method, comprising
performing, on a classical computing device, a quantum quench algorithm using simulation of a quantum Hamiltonian to perform approximate optimization, wherein the quench algorithm includes averaging state values over a plurality of times.

* * * * *